(12) United States Patent
Kim et al.

(10) Patent No.: US 12,107,204 B1
(45) Date of Patent: Oct. 1, 2024

(54) SMALL-PITCH MICRO-LEDS

(71) Applicant: Meta Platforms Technologies, LLC, Menlo Park, CA (US)

(72) Inventors: Jun-Youn Kim, Plymouth (GB); Mohsin Aziz, Plymouth (GB); Abdul Shakoor, Plymouth (GB); Gary Charles Day, Plymouth (GB)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 386 days.

(21) Appl. No.: 17/550,990

(22) Filed: Dec. 14, 2021

(51) Int. Cl.
| | |
|---|---|
| *H01L 33/62* | (2010.01) |
| *H01L 27/15* | (2006.01) |
| *H01L 33/00* | (2010.01) |
| *H01L 33/10* | (2010.01) |
| *H01L 33/32* | (2010.01) |

(52) U.S. Cl.
CPC ............ *H01L 33/62* (2013.01); *H01L 27/156* (2013.01); *H01L 33/0075* (2013.01); *H01L 33/10* (2013.01); *H01L 33/32* (2013.01); *H01L 2933/0066* (2013.01)

(58) Field of Classification Search
CPC ... H01L 33/62; H01L 27/156; H01L 33/0075; H01L 33/10; H01L 33/32; H01L 2933/0066; H01L 27/15; H01L 33/00; H01L 33/38; H01L 33/44; H01L 33/46
See application file for complete search history.

(56) References Cited

U.S. PATENT DOCUMENTS

| | | | |
|---|---|---|---|
| 10,297,712 B2 | 5/2019 | Bibl et al. | |
| 10,693,041 B2 | 6/2020 | Cich et al. | |
| 10,854,778 B1 | 12/2020 | Raring et al. | |
| 2010/0213485 A1 | 8/2010 | McKenzie et al. | |
| 2020/0235085 A1 | 7/2020 | Tao et al. | |

(Continued)

FOREIGN PATENT DOCUMENTS

EP 2176891 B1 12/2018

OTHER PUBLICATIONS

Compound Semiconductor, "The World's First CW Non-Polar GaN VCSEL," Apr. 9, 2018, vol. 24, No. 02, 13 pages.

(Continued)

*Primary Examiner* — Mohammad A Rahman
(74) *Attorney, Agent, or Firm* — Weaver Austin Villeneuve & Sampson LLP

(57) ABSTRACT

A micro-LED device and a method of fabricating the micro-LED device are disclosed. The method includes processing from a first side (e.g., p-side) of epitaxial layers of a micro-LED wafer to form individual mesa structures and a first solid metal bonding layer on the mesa structures, bonding a second solid metal bonding layer on a backplane wafer to the first solid metal bonding layer of the micro-LED wafer, removing the substrate of the micro-LED wafer and processing from a second side (e.g., n-side) of the epitaxial layers to isolate the solid metal bonding layers and form individual electrodes (e.g., anodes) for individual micro-LEDs, forming a dielectric material layer on surfaces in regions between the mesa structures, and depositing one or more metal materials in the regions between the mesa structures to form mesa sidewall reflectors and a common electrode for the micro-LEDs.

4 Claims, 25 Drawing Sheets

(56) References Cited

U.S. PATENT DOCUMENTS

2020/0251049 A1* 8/2020 Morris .................. H01L 33/62
2020/0343230 A1 10/2020 Sizov et al.
2020/0357954 A1 11/2020 Lutgen et al.

OTHER PUBLICATIONS

Cooke M., "High Brightness Nitride LEDs on Silicon through Wafer Bonding," Semiconductor Today Compounds and Advanced Silicon, Jun. 4, 2011, 3 pages.
EN-GPILED., "Filp Chip Tech," Genesis Photonics, 2014, 1 page.
Hecht J., "Photonics Frontiers: Nitride VCSELS: Nitride VCSELs Pose a Tough Challenge," Laser Focus World, Oct. 7, 2014, 8 pages.
"Leti Photonics & Microled Displays Workshop—Challenges and Solutions for Advanced Microled Displays," Leti Cea Tech, Jun. 4, 2019, 65 pages.
Zhou S., et al., "GaN-based Flip-Chip LEDs with Highly Reflective ITO/DBR p-type and via Hole-based n-type Contacts for Enhanced Current Spreading and Light Extraction," Optics & Laser Technology, Jan. 24, 2017, vol. 92, pp. 95-100.
Zhou S., et al., "Effect of Dielectric Distributed Bragg Reflector on Electrical and Optical Properties of GaN-Based Flip-Chip Light-Emitting Diodes," Micromachines, Dec. 8, 2018, vol. 09, No. 12, 9 pages.
Zhou S., et al., "Numerical and Experimental Investigation of GaN-based flip-chip light-emitting diodes with highly reflective Ag/TiW and ITO/DBR Ohmic contacts," Optics Express, Oct. 30, 2017, vol. 25, No. 22, 13 pages.

* cited by examiner

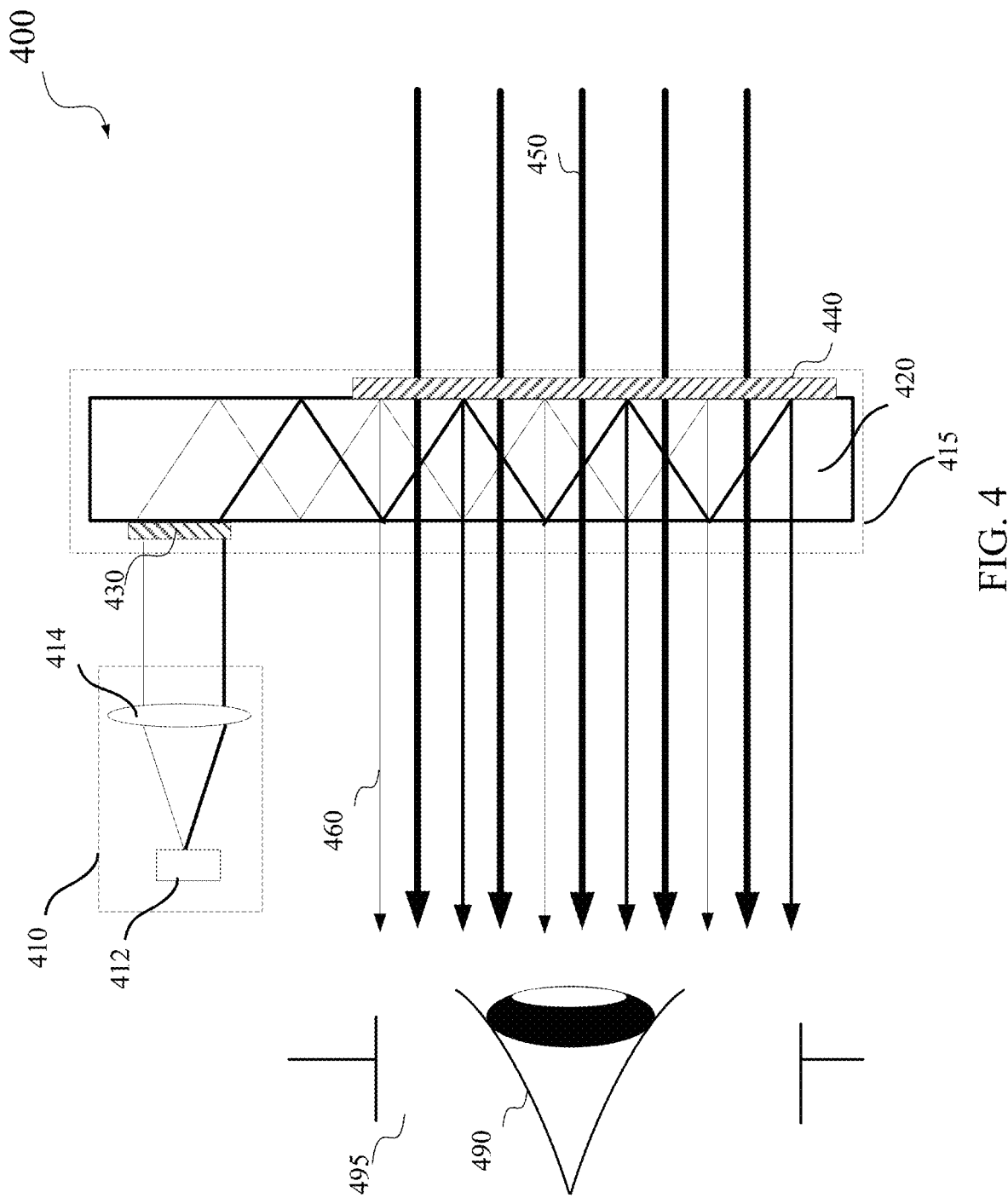

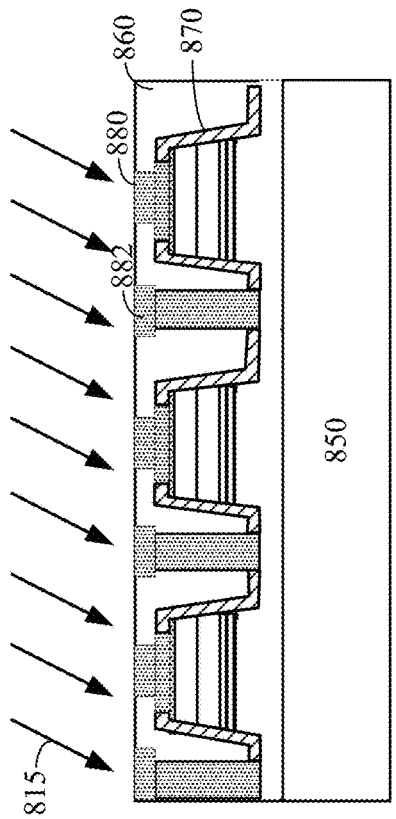
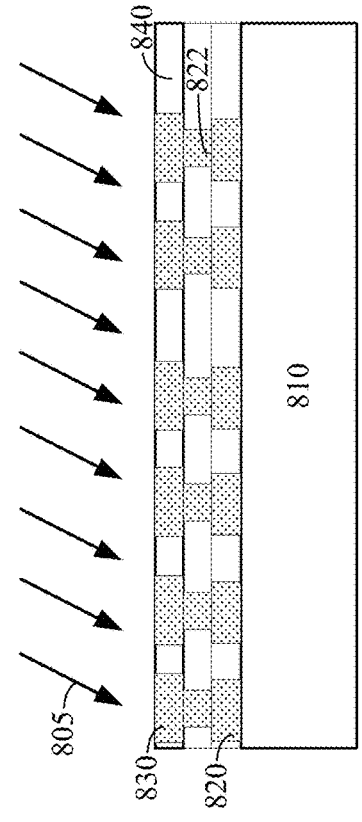
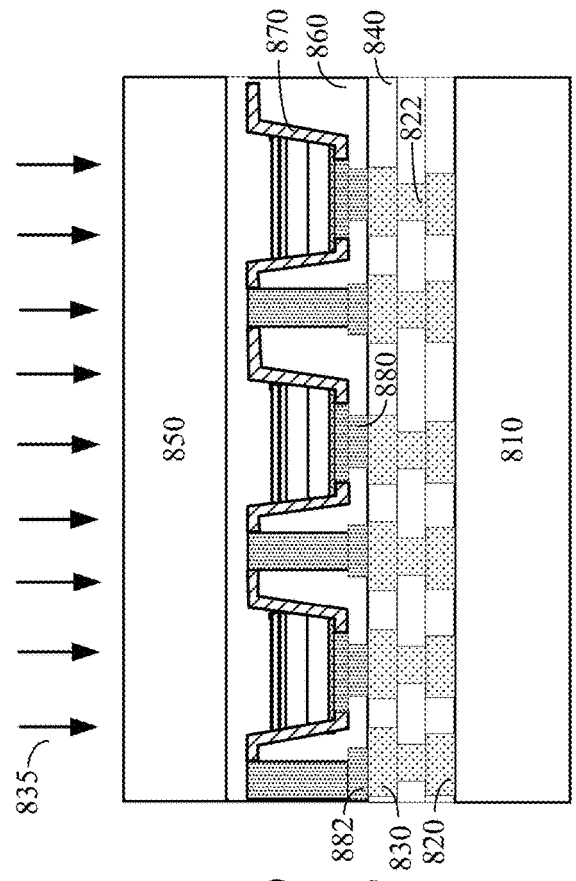
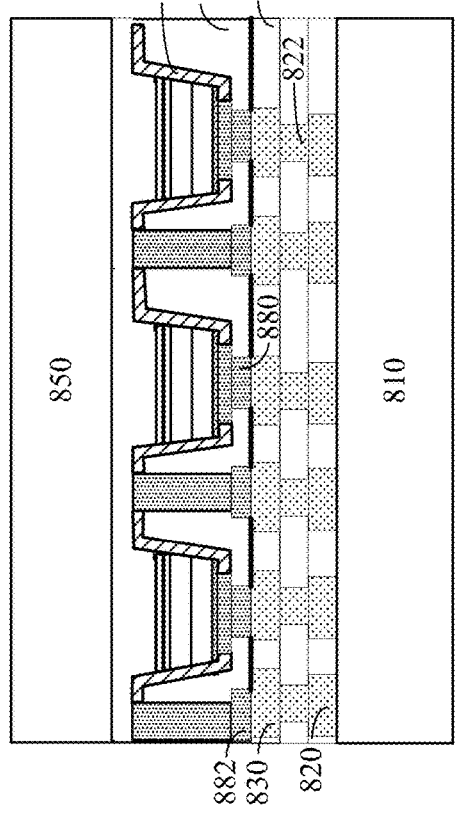

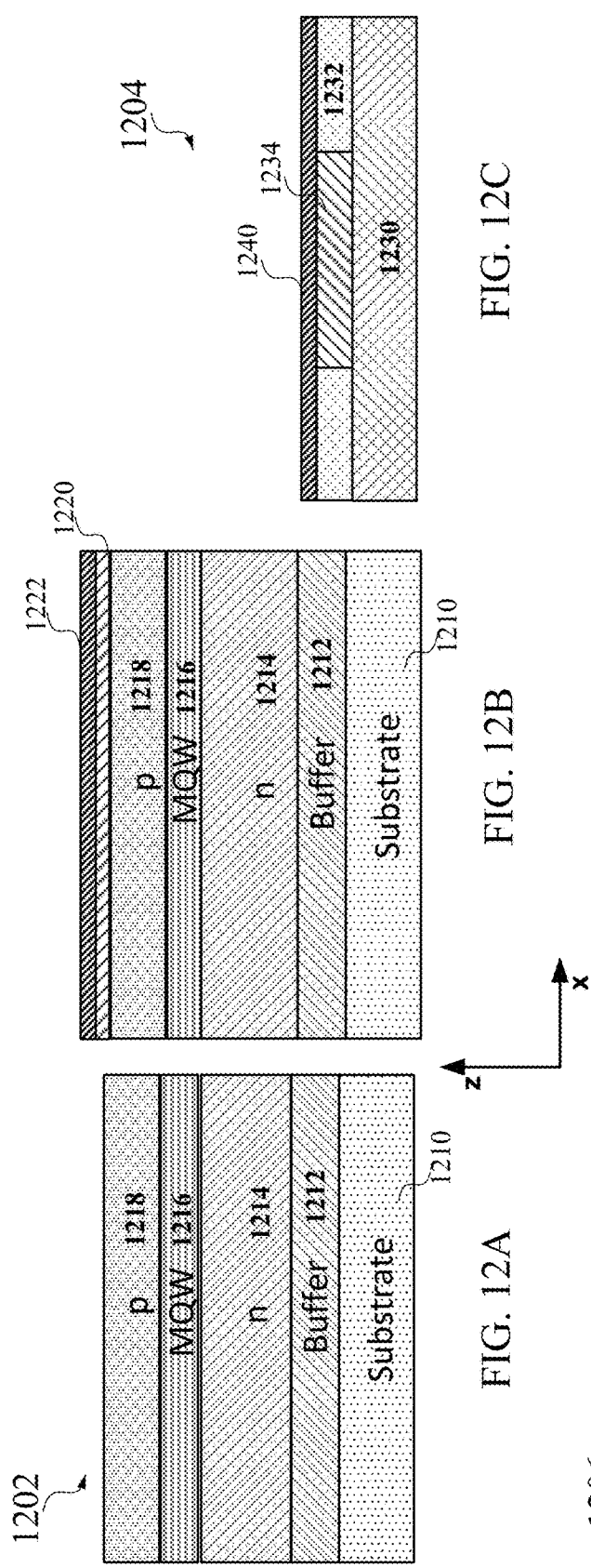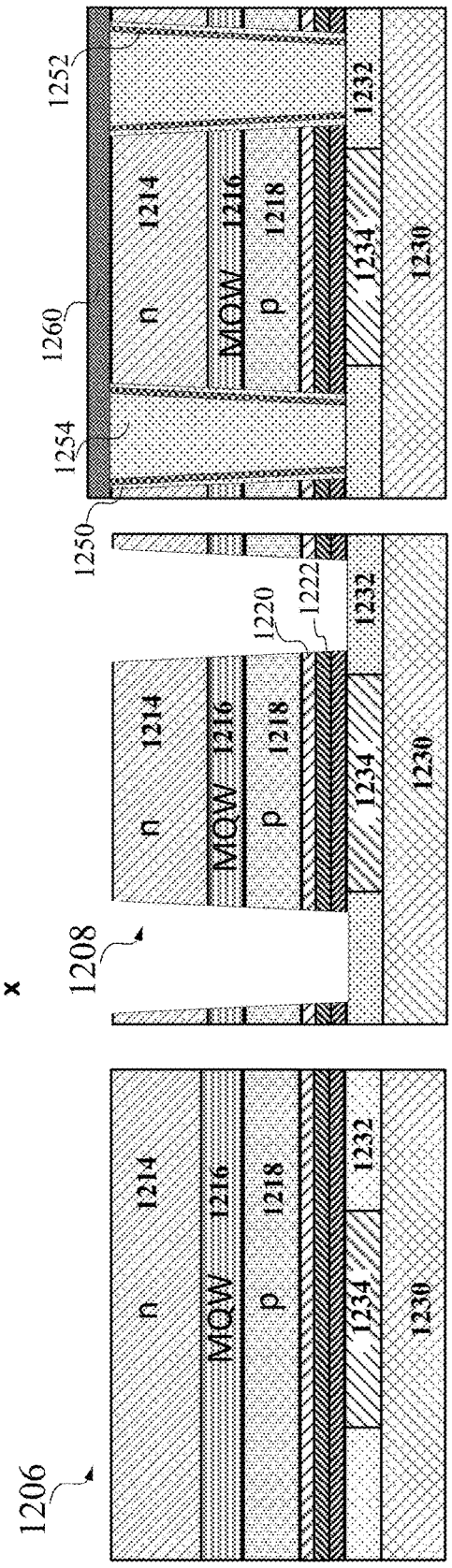
FIG. 12A
FIG. 12B
FIG. 12C
FIG. 12D
FIG. 12E
FIG. 12F

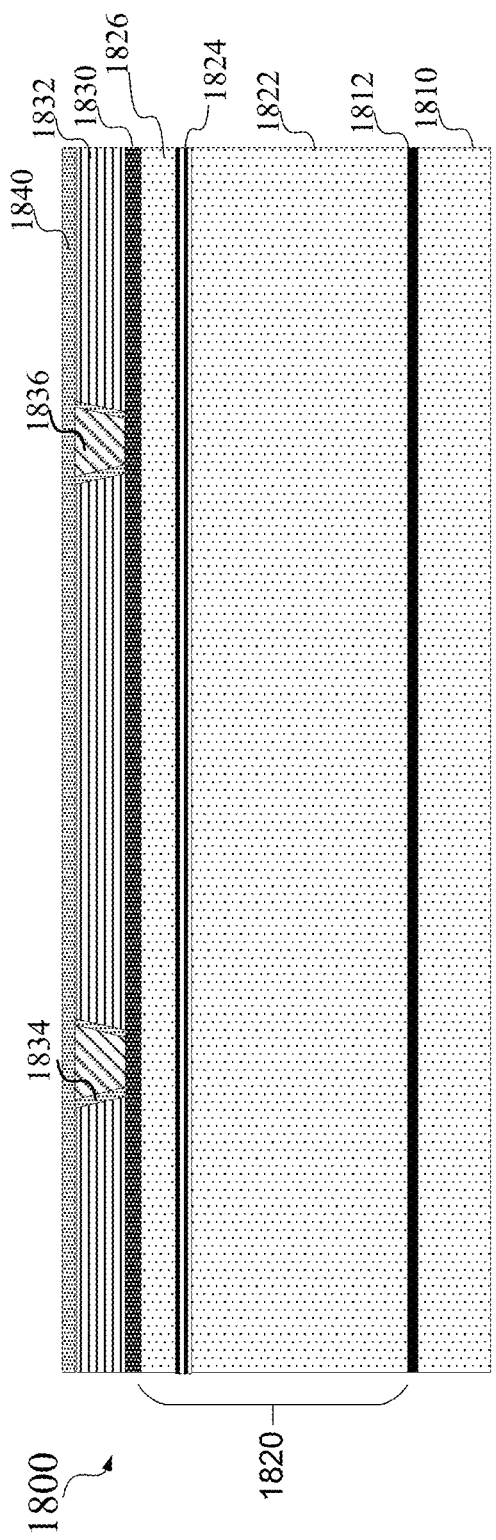
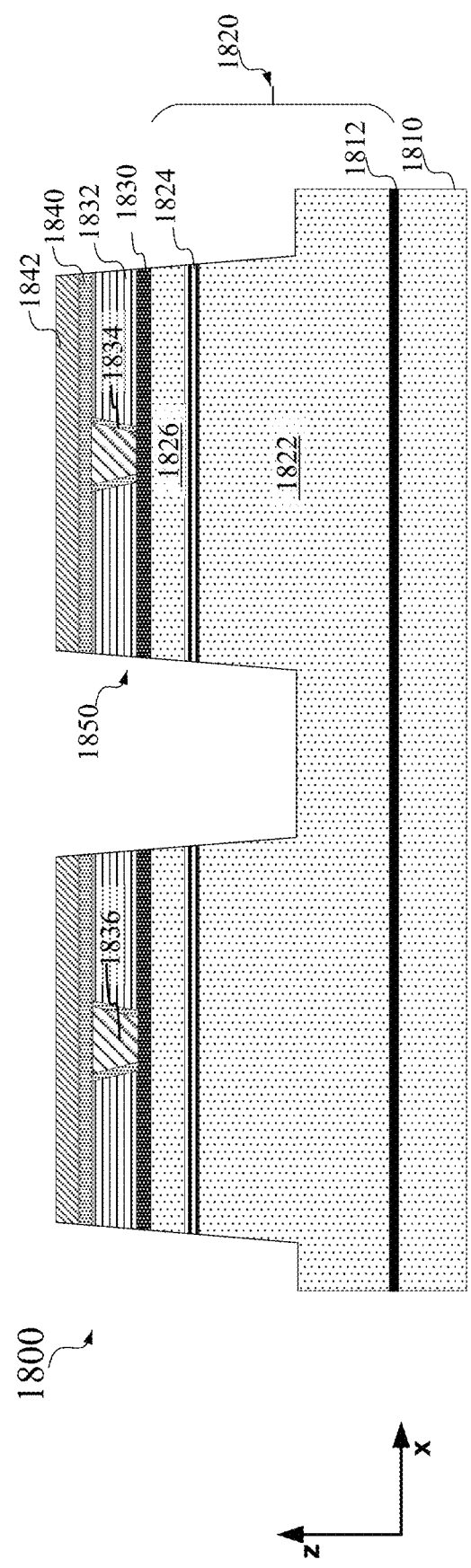
FIG. 18A
FIG. 18B

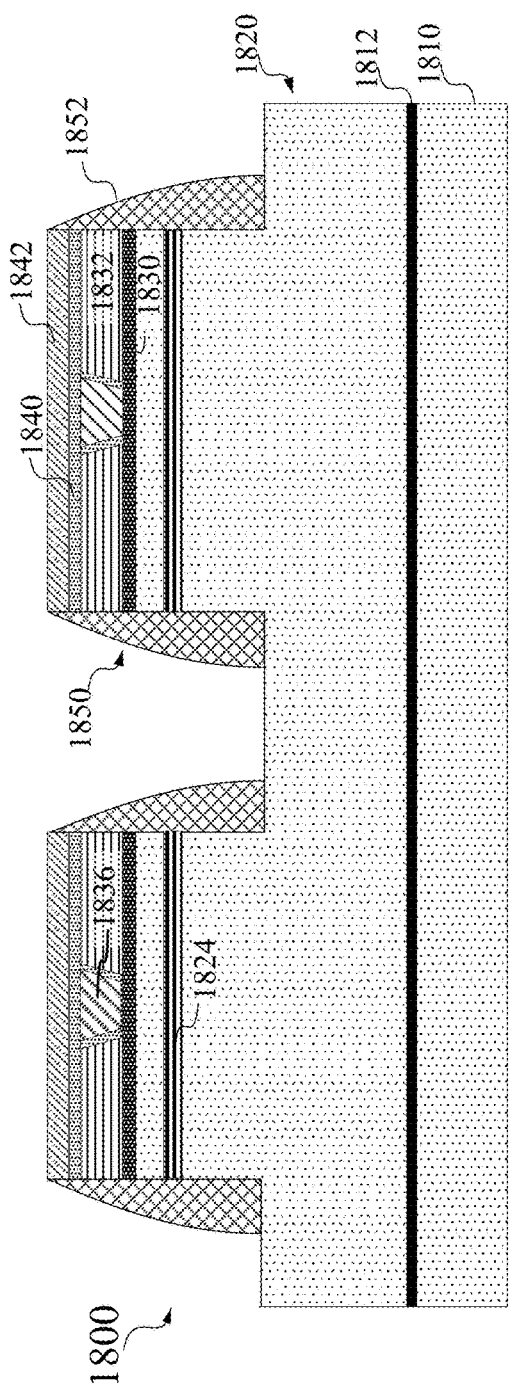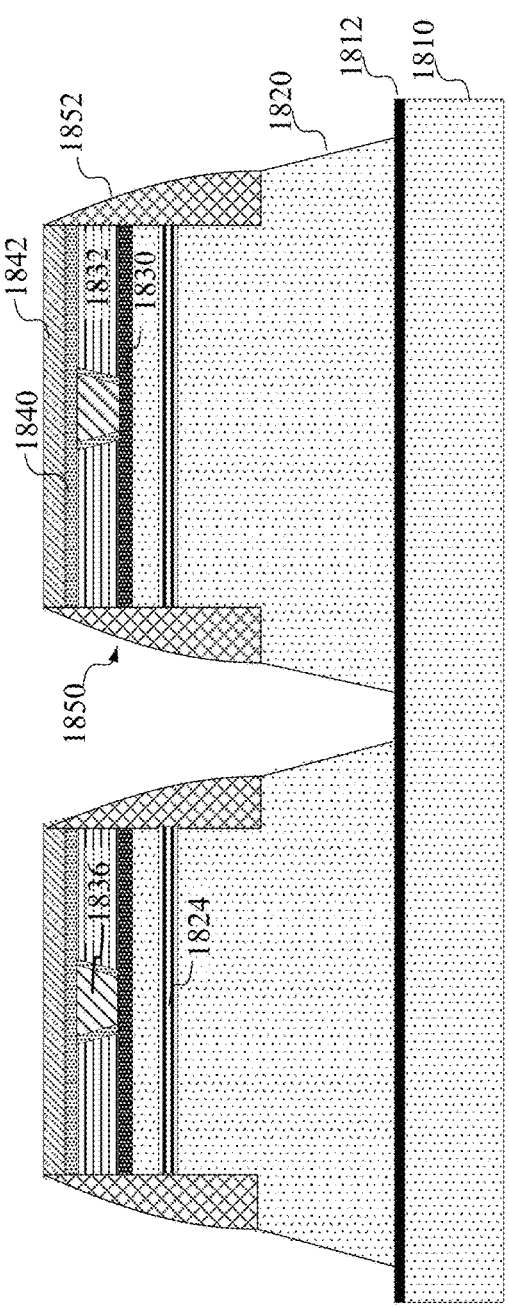
FIG. 18C
FIG. 18D

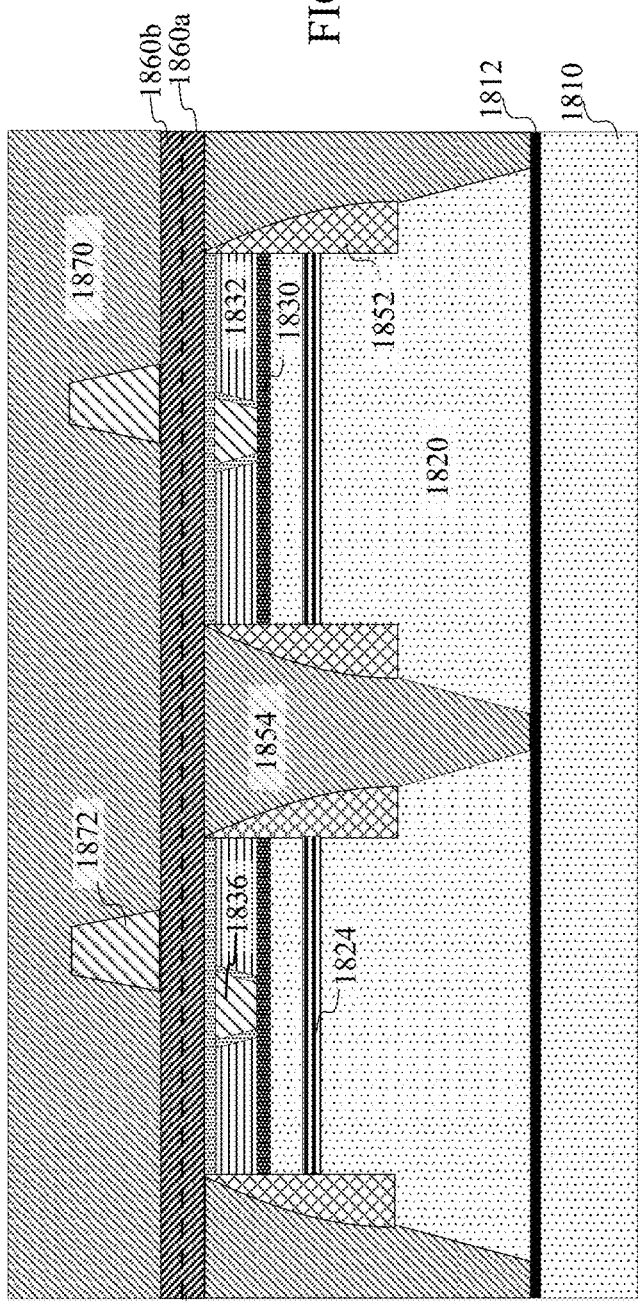
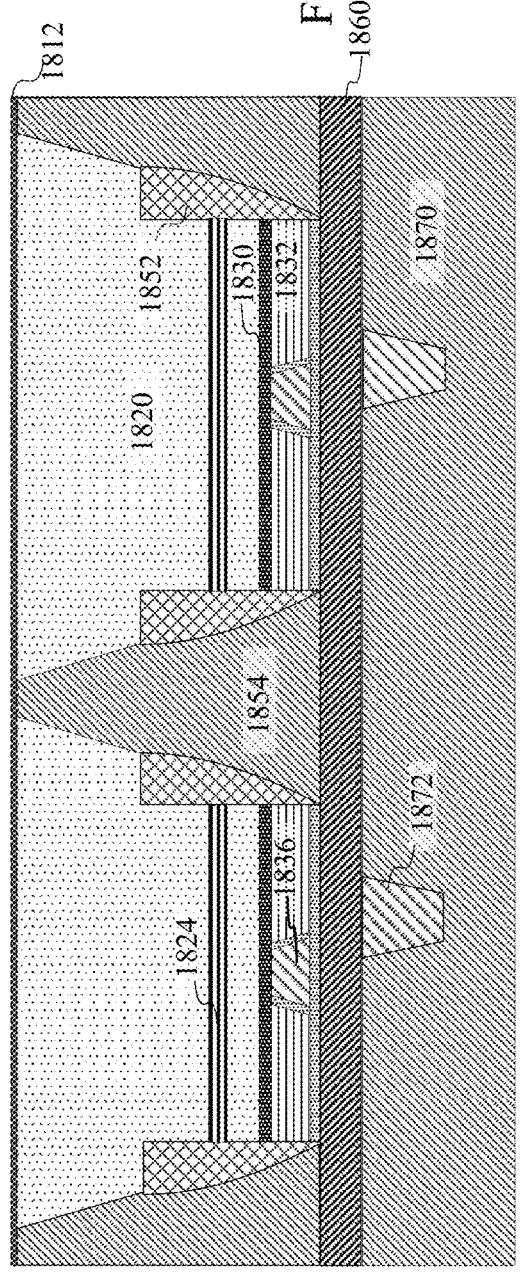
FIG. 18G
FIG. 18H

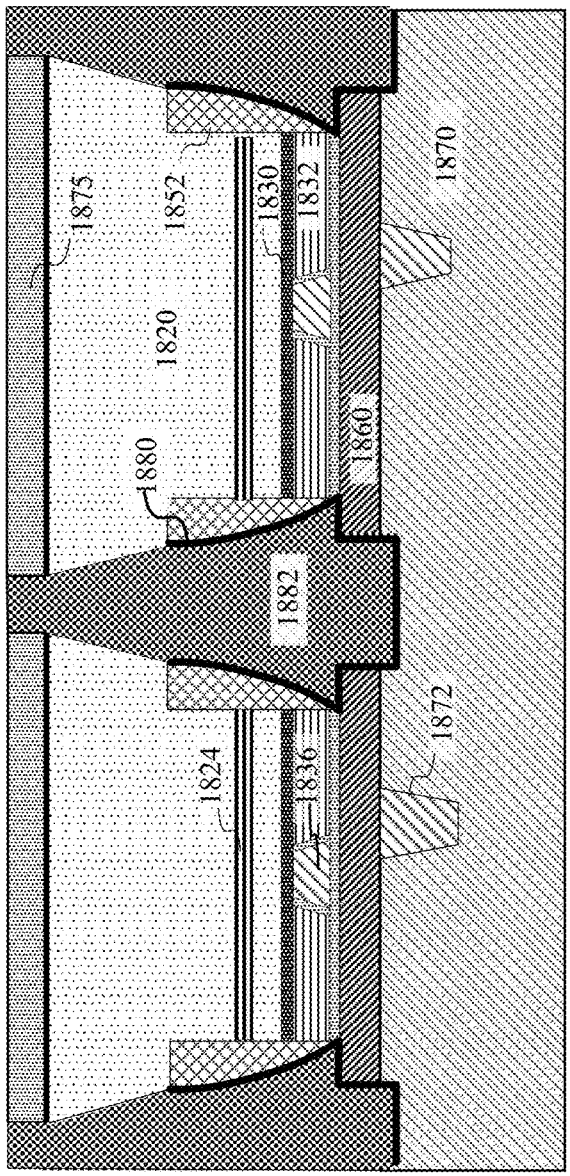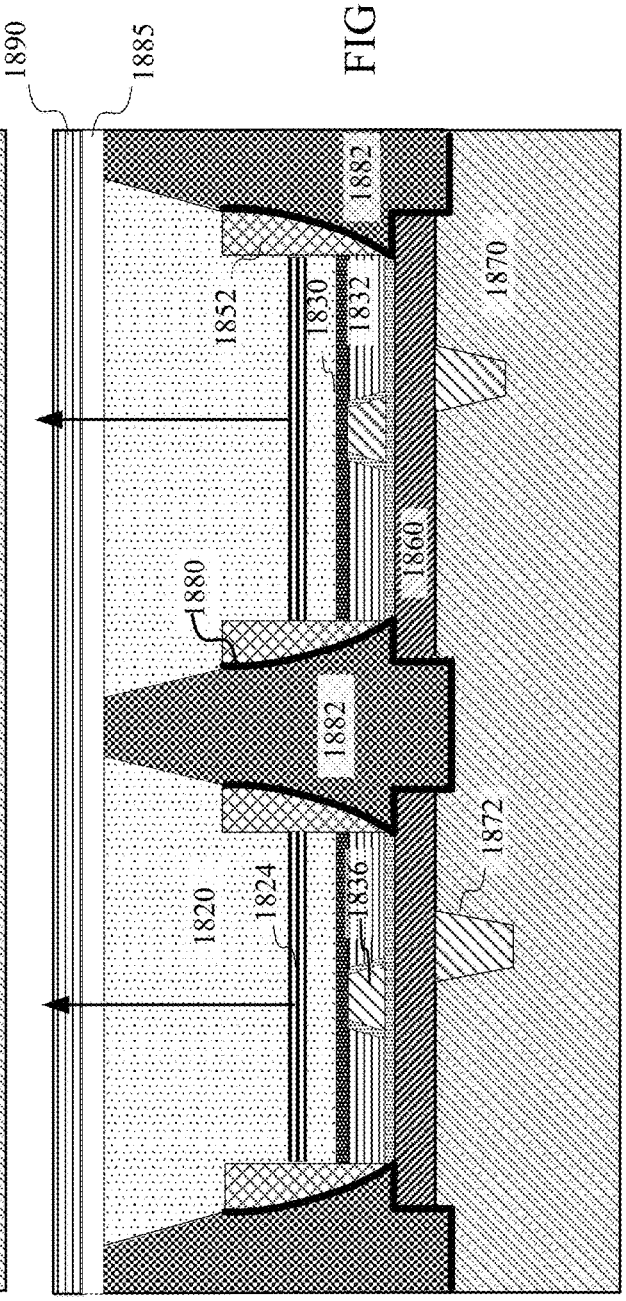

SMALL-PITCH MICRO-LEDS

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("LEDs") based on III-V semiconductors, such as alloys of AlN, GaN, InN, InGaN, AlGaInP, other ternary and quaternary arsenide and phosphide alloys including GaInAsPN, AlGaInSb, and the like, have begun to be developed for various display applications due to their small size (e.g., with a linear dimension less than about 20 μm, less than about 10 μm, less than about 5 μm, or less than about 2 μm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to light emitting diode (LED) devices. More specifically, and without limitation, techniques disclosed herein relate to a micro-LED display device including a micro-LED array and pixel drive circuits, where the micro-LED display device is formed by processing from a first side (e.g., p-side) of a micro-LED wafer to form mesa structures, alignment error-tolerant bonding of the micro-LED wafer to a backplane wafer, and post-bonding processing (e.g., from n-side) to form micro-LED electrodes and other features (e.g., light extraction structures). Various inventive embodiments are described herein, including devices, systems, methods, processes, materials, and the like.

According to certain embodiments, a method may include obtaining a micro-light emitting diode (micro-LED) wafer that includes a substrate, epitaxial layers grown on the substrate, and a back reflector layer on a first side of the epitaxial layers; etching through the back reflector layer and at least a portion of the epitaxial layers to form mesa structures of micro-LEDs, each mesa structure of the mesa structures including a back reflector formed in the back reflector layer; forming a passivation layer on sidewalls of the mesa structures; depositing an oxide material in regions between the mesa structures; depositing a first contiguous metal bonding layer on the back reflector layer; bonding a second contiguous metal bonding layer on a backplane wafer to the first contiguous metal bonding layer; removing the substrate on a second side of the epitaxial layers; removing, from the second side of the epitaxial layers, the oxide material in the regions between the mesa structures; etching through the first contiguous metal bonding layer and the second contiguous metal bonding layer in regions under the oxide material to form individual metal electrodes of the micro-LEDs; forming a dielectric material layer on exposed surfaces in the regions between the mesa structures; and depositing one or more metal materials in the regions between the mesa structures to form mesa sidewall reflectors and a common electrode for the micro-LEDs. In some embodiments, the method may include forming a transparent conductive layer on top of the mesa structures to form, in combination with the one or more metal materials, a common electrode for the micro-LEDS. In some embodiments, the method may include forming a partial reflector on top of the mesa structures, where the partial reflector and the back reflector of each mesa structure of the mesa structures may form a resonant cavity. The partial reflector may include, for example, a distributed Bragg reflector (DBR) that includes a plurality of transparent dielectric layers.

In some embodiments, the backplane wafer may include a plurality of metal contacts coupled to the second contiguous metal bonding layer, where each metal contact of the plurality of metal contacts may align with a region of a respective metal electrode of the individual metal electrodes of the micro-LEDs. In some embodiments, each metal contact of the plurality of metal contacts may be characterized by a linear dimension less than 30% of a pitch of the mesa structures. In some embodiments, each metal electrode of the individual metal electrodes of the micro-LEDs may have an area that is equal to or greater than an area of the back reflector in each mesa structure of the mesa structures. In some embodiments, the epitaxial layers may include an n-type semiconductor layer at the second side, a p-type semiconductor layer at the first side, and an active region between the n-type semiconductor layer and the p-type semiconductor layer and configured to emit light. In some embodiments, the epitaxial layers may include a III-N layer, and the individual metal electrodes of the micro-LEDs may be anodes for the micro-LEDs. In some embodiments, the epitaxial layers may include a III-P layer, and the individual metal electrodes of the micro-LEDs may be cathodes for the micro-LEDs.

In some embodiments, the method may also include etching, after forming the passivation layer and before depositing the oxide material, the epitaxial layers to expose sidewall electrical contact regions for the micro-LEDs, where the one or more metal materials deposited in the regions between the mesa structures may be in contact with the exposed sidewall electrical contact regions for the micro-LEDs. In some embodiments, the micro-LED wafer may include an etch stop layer between the substrate and the epitaxial layers, etching the epitaxial layers to expose sidewall electrical contact regions for the micro-LEDs may include etching the epitaxial layers down to the etch stop layer, and removing the substrate on the second side of the epitaxial layers may include removing the substrate at the etch stop layer. In some embodiments, the method may include, before forming the passivation layer on the sidewalls of the mesa structures, treating the sidewalls of the mesa structures using KOH or plasma.

In some embodiments, the back reflector layer may include a distributed Bragg reflector including a plurality of transparent oxide layers and a plurality of metal plugs in the plurality of transparent oxide layers, a transparent current spreading layer between the epitaxial layers and the distributed Bragg reflector, and a conductive material layer on the distributed Bragg reflector and opposing the transparent current spreading layer, where the plurality of metal plugs may electrically couple the transparent current spreading layer to the conductive material layer. In some embodiments, a pitch of the plurality of metal plugs may be equal to a pitch of the mesa structures, and a linear dimension of each metal plug of the plurality of metal plugs may be less than 20% of the pitch of the mesa structures. In some embodiments, obtaining the micro-LED wafer may include etching, using the transparent current spreading layer as an etch stop layer, the plurality of transparent oxide layers to form a plurality of trenches in the plurality of transparent oxide layers, and forming the plurality of metal plugs in the plurality of trenches. In some embodiments, the back reflector layer may include a conductive distributed Bragg reflector that includes a plurality of semiconductor layers or a plurality of transparent conductive oxide layers.

According to some embodiments, a micro-LED device may include a backplane including pixel drive circuits and a plurality of metal contacts in a first dielectric material layer, an array of micro-LEDs on the backplane, and a common electrode between micro-LEDs of the array of micro-LEDs. Each micro-LED of the array of micro-LEDs may include a metal electrode bonded to a metal contact of the plurality of metal contacts, a second dielectric layer on sidewalls of the metal electrode, a back reflector on the metal electrode, epitaxial layers on the back reflector and configured to emit visible light, and a passivation layer on sidewalls of the back reflector and a portion of the epitaxial layers. The metal contact may have an area smaller than an area of the metal electrode and align with a region of the metal electrode. An area of a first side of the epitaxial layers adjacent to the back reflector may be equal to or less than the area of the metal electrode and may be equal to or less than an area of a second side of the epitaxial layers opposing the first side. The common electrode may be coupled to sidewalls of the second side of the epitaxial layers in each micro-LED of the array of micro-LEDs.

In some embodiments, the micro-LED device may include a partial reflector layer on the array of micro-LEDs, where the partial reflector layer and the back reflector of each micro-LED of the array of micro-LEDs may form a resonant cavity for the visible light emitted in the epitaxial layers. In some embodiments, the back reflector may include a distributed Bragg reflector that includes a plurality of transparent oxide layers and a metal plug in the plurality of transparent oxide layers, a transparent current spreading layer between the epitaxial layers and the distributed Bragg reflector, and a conductive material layer on the distributed Bragg reflector and opposing the transparent current spreading layer. The metal plug may electrically couple the transparent current spreading layer to the conductive material layer. An area of the back reflector may be equal to the area of the first side of the epitaxial layers. In some embodiments, a pitch of the array of micro-LEDs may be less than about 3 μm, and a linear dimension of the metal plug may be less than 20% of the pitch of the array of micro-LEDs.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 4 illustrates an example of an optical see-through augmented reality system including a waveguide display according to certain embodiments.

FIGS. 8A-8D illustrate an example of a method of hybrid bonding for arrays of LEDs according to certain embodiments.

FIGS. 12A-12F illustrate an example of a method of fabricating a micro-LED device using alignment-free metal-to-metal bonding and post-bonding mesa formation.

FIGS. 18A-18L illustrate an example of a process for fabricating the micro-LED device of FIG. 17 according to certain embodiments.

Figure 1:
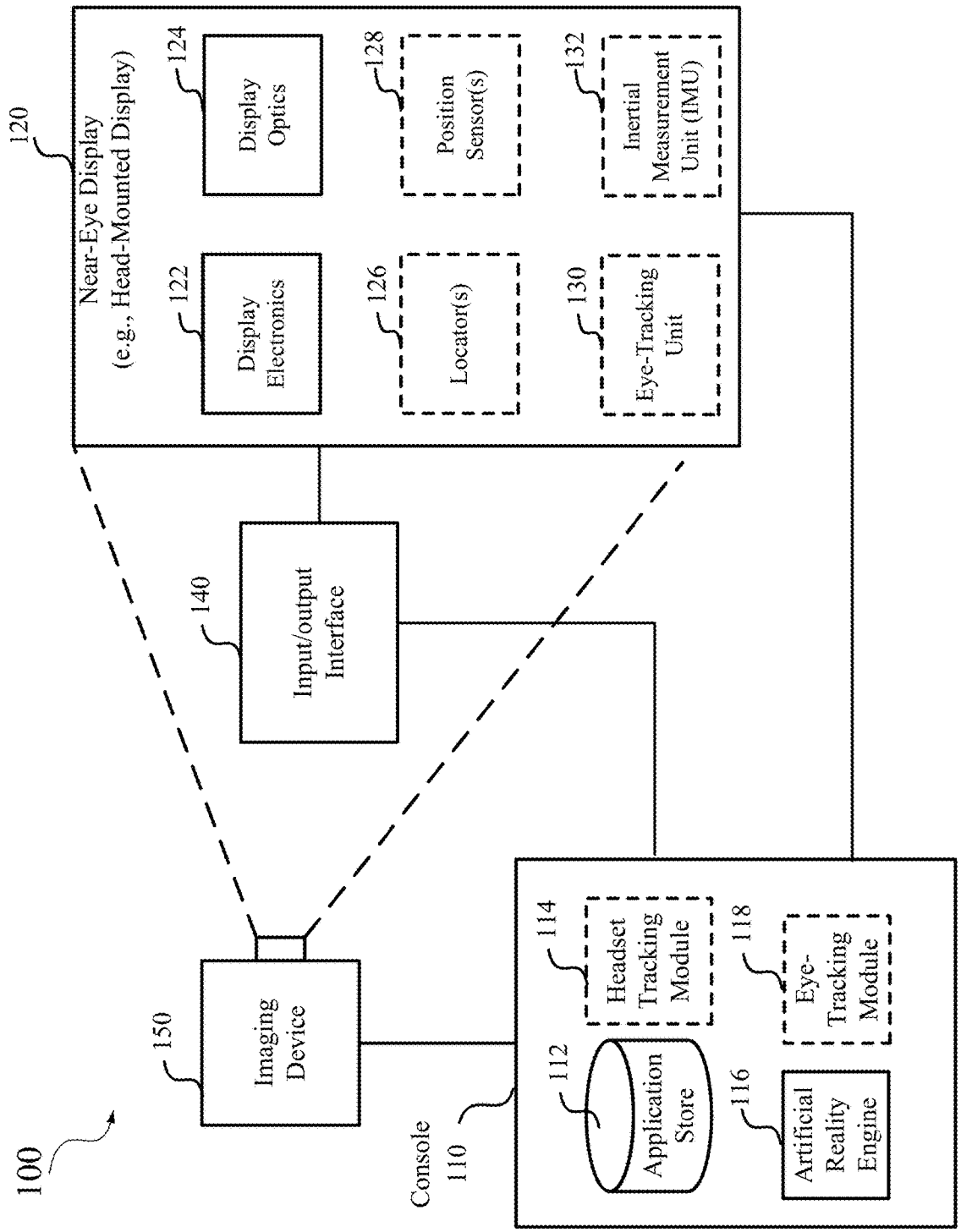
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light emitting diode (LED) devices. More specifically, and without limitation, techniques disclosed herein relate to a micro-LED display device including a micro-LED array and pixel drive circuits, where the micro-LED display device is formed by processing from a first side (e.g., p-side) of a micro-LED wafer to form mesa structures, alignment error-tolerant bonding of the micro-LED wafer to a backplane wafer, and post-bonding processing (e.g., from n-side) to form micro-LED electrodes and other features (e.g., light extraction structures). Various inventive embodiments are described herein, including devices, systems, methods, processes, materials, and the like.

LEDs with small pitches (e.g., less than about 10 µm, less than about 5 µm, less than about 3 µm, or less than about 2 µm) may be used in high-resolution display systems. For example, augmented reality (AR) and virtual reality (VR) applications may use near-eye displays that include tiny light emitters such as micro-LEDs. Micro-LEDs in high-resolution display systems are controlled by pixel drive circuits that provide drive currents to the micro-LEDs based on pixel data of the display images such that the micro-LEDs may emit light with desired intensities to form the display images. Micro-LEDs may be fabricated by epitaxially growing III-V semiconductor material layers on a growth substrate, whereas the pixel drive circuits are generally fabricated on silicon wafers using processing technology developed for fabricating complementary metal-oxide-semiconductor (CMOS) integrated circuits. The wafer that includes CMOS pixel drive circuits fabricated thereon is referred to herein as a backplane wafer or a CMOS backplane. Micro-LED arrays on a die or wafer may be bonded to the CMOS backplane, such that individual micro-LEDs in the micro-LED arrays may be electrically connected to the corresponding pixel drive circuits and thus may become individually addressable to receive respective drive currents for displaying an image. Due to the small pitches of the micro-LED arrays and the small dimensions of individual micro-LEDs, it can be difficult to electrically connect the pixel drive circuits to the electrodes of corresponding micro-LEDs using, for example, bonding wires, bonding bumps, and the like.

In some implementations, the micro-LED arrays may be bonded face-to-face with the pixel drive circuits using metal (e.g., Cu, Au, Al, W, Ti, or a metal alloy) bonding pads on surfaces of the micro-LED arrays (or the micro-LED wafer) and metal bonding pads on the CMOS backplane, such that no routing wires may be needed and the interconnects between the micro-LEDs and the pixel drive circuits can be short, which may enable high-density and high-performance bonding. The bonding may be performed using a hybrid bonding process, where dielectric materials (e.g., $SiO_2$, SiN, or SiCN) at the bonding surfaces may be bonded at a lower temp through dielectric-to-dielectric bonding and then the bonded wafer stack may be annealed at an elevated temperature to cause metal-to-metal bonding of the metal bonding pads.

In hybrid bonding of small-pitch micro-LEDs, it can be challenging to precisely align the metal bonding pads on the micro-LED arrays with the metal bonding pads on the pixel drive circuits to form reliable bonding at the interfaces that include both dielectric materials and metal bonding pads. For example, when the pitch of a micro-LED array is about 2 to 4 microns or lower, each metal bonding pad may have a linear dimension less than about 1 µm (e.g., about or less than 25% of the pitch of the micro-LED array) in order to avoid shorting to adjacent micro-LEDs and to leave a sufficiently large area of dielectric materials (e.g., with a linear dimension about 75% of the micro-LED pitch or larger) to achieve a sufficiently high bonding strength through the dielectric bonding. However, small bonding pads may be less tolerant to misalignments between the bonding pads, which may reduce the metal bonding area, increase the contact resistance (or may even be an open circuit), and/or may cause diffusion of metal atoms to the dielectric materials and the semiconductor materials. Thus, precise alignment of the bonding pads at the bonding surface of a micro-LED array and the bonding pads at the bonding surface of a backplane wafer may be needed in the hybrid bonding processes. The accuracy of die-to-wafer or wafer-to-wafer bonding alignment may be on the order of about 0.5 µm or about 1 µm even using state-of-art equipment, which may not be adequate for bonding small-pitch micro-LED arrays (e.g., with a linear dimension of the bonding pads on the order of 1 µm, 0.5 µm, or shorter) to CMOS pixel drive circuits. In addition, the micro-LED wafer and/or the CMOS backplane may have wafer bowing due to internal strain in the wafer, which may be caused by crystal lattice constant mismatching between the semiconductor layers and/or coefficient of temperature expansion (CTE) matching between different layers. The wafer bowing may make it even more difficult to precisely align the bonding pads. Furthermore, the annealing process for the metal-to-metal bonding may need to be precisely controlled so that the metal bonding pads may expand sufficiently to fill voids caused by dishing at the bonding surfaces and make good electrical contacts, but may not expand too much to cause dielectric delamination at the dielectric-dielectric bonding interfaces.

In some implementations, to avoid precise alignment for the bonding, a micro-LED wafer may be bonded to a backplane wafer after the growth of the epitaxial layers and before the formation of individual micro-LEDs on the micro-LED wafer. The micro-LED wafer and the backplane wafer may be bonded through metal-to-metal bonding of two solid metal bonding layers on the two wafers. No alignment is needed for bonding the solid metal bonding layers. After the bonding, the epitaxial layers and the metal bonding layers in the bonded wafer stack may be etched to form individual micro-LEDs. The etching process can have much higher alignment accuracy than the bonding process and thus may form individual micro-LEDs that align with the underlying pixel drive circuits. This process may need to be performed at high temperatures and/or may not have the desired bonding strength due to the lower metal-to-metal bonding strength. This process may also include metal etching after deep etching of the epitaxial layers, where the metal etching may redeposit metal materials on sidewalls of the etched epitaxial (e.g., active) layers and thus may contaminate the epitaxial layers and reduce the quantum efficiency and reliability of the micro-LEDs. In this process, it may also be difficult to perform wet treatment (e.g., using KOH) and/or plasma treatment after the bonding and etching in order to remove oxide related compounds and surface defects at etched sidewalls of the active layers to improve the quantum efficiency of the micro-LEDs.

In addition, in many micro-LED structures, a highly reflective metal layer (e.g., an aluminum or silver layer) may be used as a back reflector to redirect photons generated in the active layers towards a light emitting surface of a micro-LED to improve the light extraction efficiency. The highly reflective metal material (e.g., silver) may diffuse into semiconductor material layers and/or dielectric material layers at a high diffusion rate (in particular, when the operating current and/or temperature is high), and thus may cause a large leakage current. To reduce the metal diffusion and the leakage current, a conductive barrier layer (e.g., a capping metal layer) having a low diffusion rate (e.g., a titanium, tungsten, and/or TiN layer) may be formed around the reflective metal layer. A dielectric layer may be formed on the barrier layer to provide additional isolation. For a micro-LED array with a small pitch, such as less than about 4 µm, less than about 3 µm, or less than about 2 µm, the linear lateral dimension of each micro-LED may be less than about 3 µm, less than about 2 µm, less than about 1.5 µm, or even less than about 1.0 µm. As such, the lateral dimensions of the reflective metal layer and the barrier layer may be very small, thus leaving very little margin for alignment error during the subsequent fabrication processes. For example, the process of opening apertures in the dielectric layer on the barrier layer to form metal plugs for making electrical contacts with the reflective metal layer via the barrier layer may reach the lithographic limit and may need very precise alignment, since the lateral size of the apertures may need to be even smaller than the lateral size of the barrier layer. When the pitch of the micro-LED array is reduced, the lateral size of the reflective metal layer may need to be reduced more in order to leave sufficient room for the barrier layer and the dielectric layer at the sidewalls of the reflective metal layer to maintain a low leakage. Reducing the size of the reflective metal layer may reduce the overall reflectivity of the back reflector, and thus may reduce the light extraction efficiency of the micro-LEDs.

According to certain embodiments, a micro-LED device may be fabricated by (1) processing from a first side (e.g., p-side) of the epitaxial layers of a micro-LED wafer to form individual mesa structures and a solid metal bonding layer; (2) alignment error-tolerant bonding of a backplane wafer to the solid metal bonding layer of the micro-LED wafer; and (3) removing the substrate of the micro-LED wafer and processing from a second side (e.g., n-side) of the epitaxial layers to isolate the solid metal bonding layer, thereby forming individual electrodes (e.g., anodes) for individual micro-LEDs. In some embodiments, each mesa structure may include a back reflector formed by a distributed Bragg reflector (DBR) on the first side of the epitaxial layers to improve the reflectivity and light extraction efficiency. For example, the back reflector may include a small metal plug in dielectric DBR layers to conduct current or may include transparent conductive DBR layers, and thus may have a much higher reflectivity than reflective metal reflectors. In some embodiments, other features (e.g., micro-lenses, other light extraction structures, or a partial reflector) may be formed on the second-side of the epitaxial layers during the processing from the second side of the epitaxial layers. For example, a front partial reflector (e.g., DBR) may be fabricated on the second-side of the epitaxial layers to form a resonant cavity with the back reflector, thereby forming resonant-cavity LEDs (RCLEDs).

Compared with the hybrid bonding methods, the micro-LED device and the fabrication method disclosed herein may not need precise alignment between the micro-LED wafer and the backplane wafer, and may not need annealing for bonding pad dishing control. Therefore, yield and reliability may be improved. Compared with the post-bonding mesa formation methods, the bonding metal etching in the method disclosed herein may be performed after a passivation layer is formed on the mesa sidewall, and thus may not cause active layer contamination that may reduce the internal quantum efficiency and reliability. In addition, pre-bonding etching of epitaxial layers from the side (e.g., p side) that is close to the pixel drive circuits after the bonding may form mesa structures with more desirable shapes for light extraction efficiency improvement, and may facilitate sidewall surface treatment after the initial epitaxial layer etching. The use of DBR back reflectors rather than metal back reflectors may significantly increase the light extraction efficiency for small micro-LEDs, such as micro-LEDs with pitches less than about 3 µm or less than about 2 µm. RCLEDs that can emit light within a narrow spectral range and a small emission cone and with high intensity and high directionality may be fabricated using the methods disclosed herein. Light emitted by the RCLEDs may be more efficiently collected by the display optics which may have limited receptance angles (e.g., within about ±18.50).

The micro-LED devices described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "LED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (LED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IU 132 may be an electronic device that generates fast calibration data based on measurement signals received from one or more of position sensors 128. Position sensors 128 may be located external to IMU 132, internal to IU 132, or any combination thereof. Based on the one or more measurement signals from one or more position sensors 128, IU 132 may generate fast calibration data indicating an estimated position of near-eye display 120 relative to an initial position of near-eye display 120. For example, IU 132 may integrate measurement signals received from accelerometers over time to estimate a velocity vector and integrate the velocity vector over time to determine an estimated position of a reference point on near-eye display 120. Alternatively, IU 132 may provide the sampled measurement signals to console 110, which may determine the fast calibration data. While the reference point may generally be defined as a point in space, in various embodiments, the reference point may also be defined as a point within near-eye display 120 (e.g., a center of IU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit.

Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to determine the eye's orientation more accurately.

Figure 2:
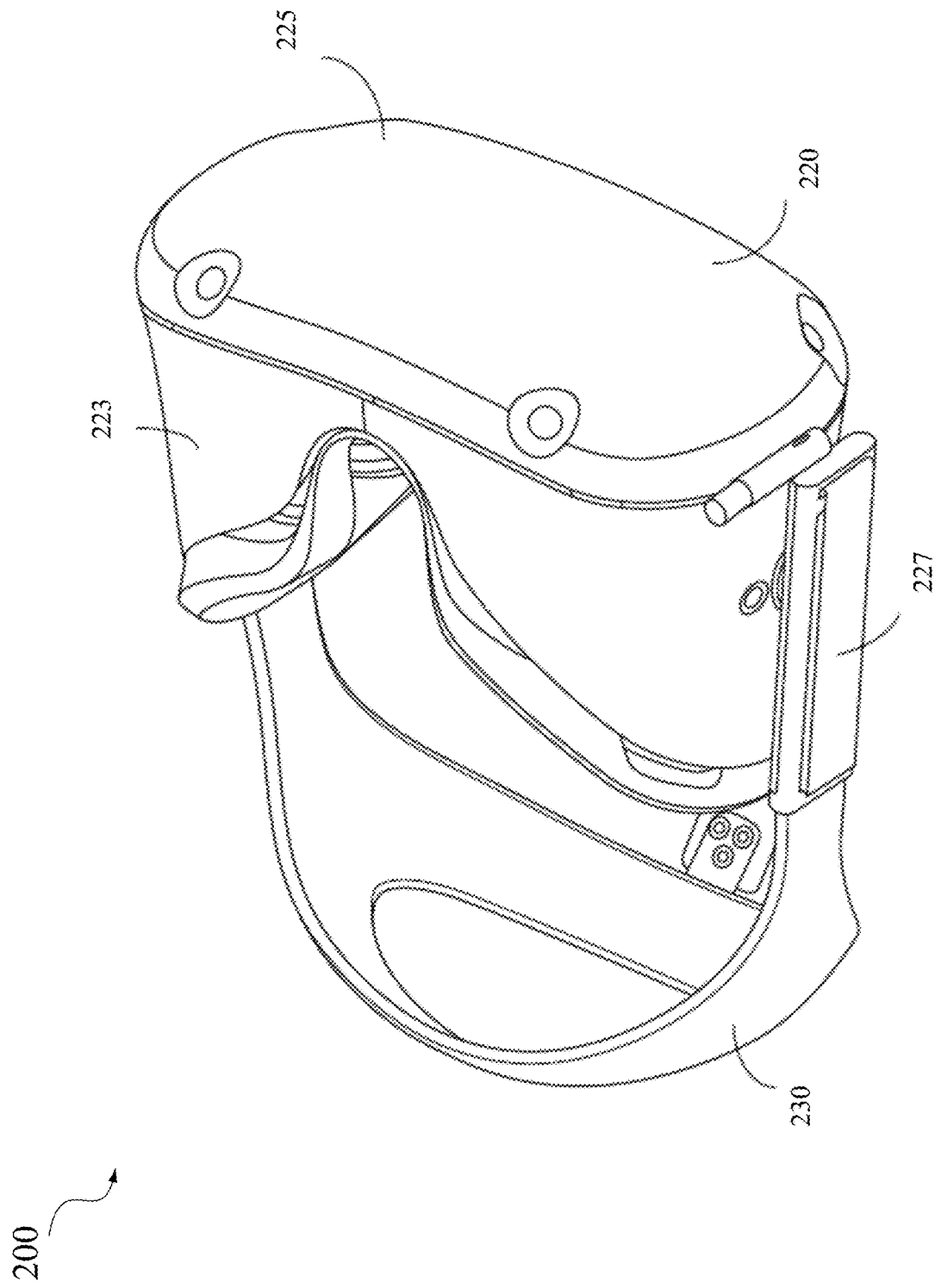
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMO-LED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HID device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
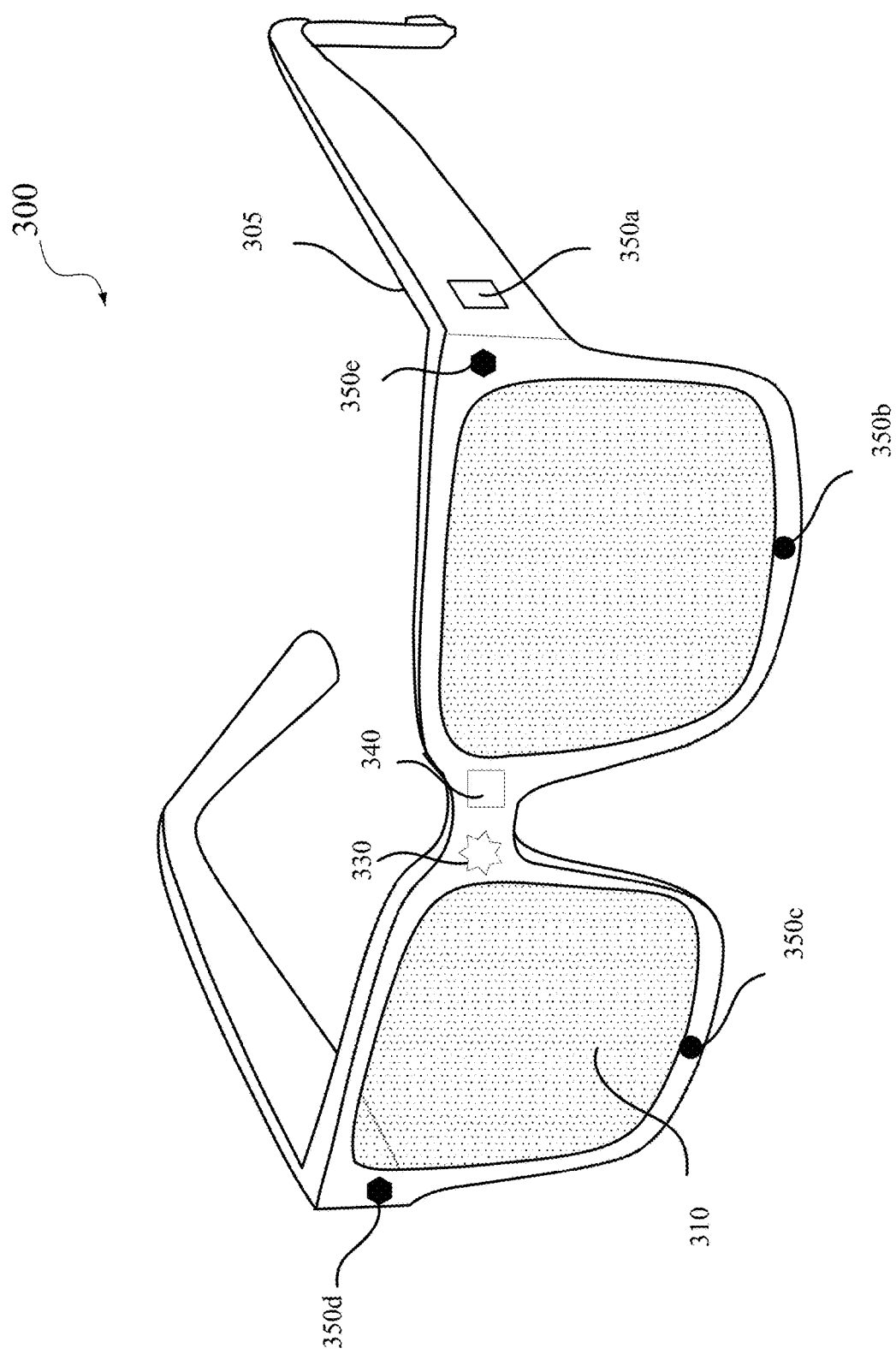
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements, prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

Figure 5B:
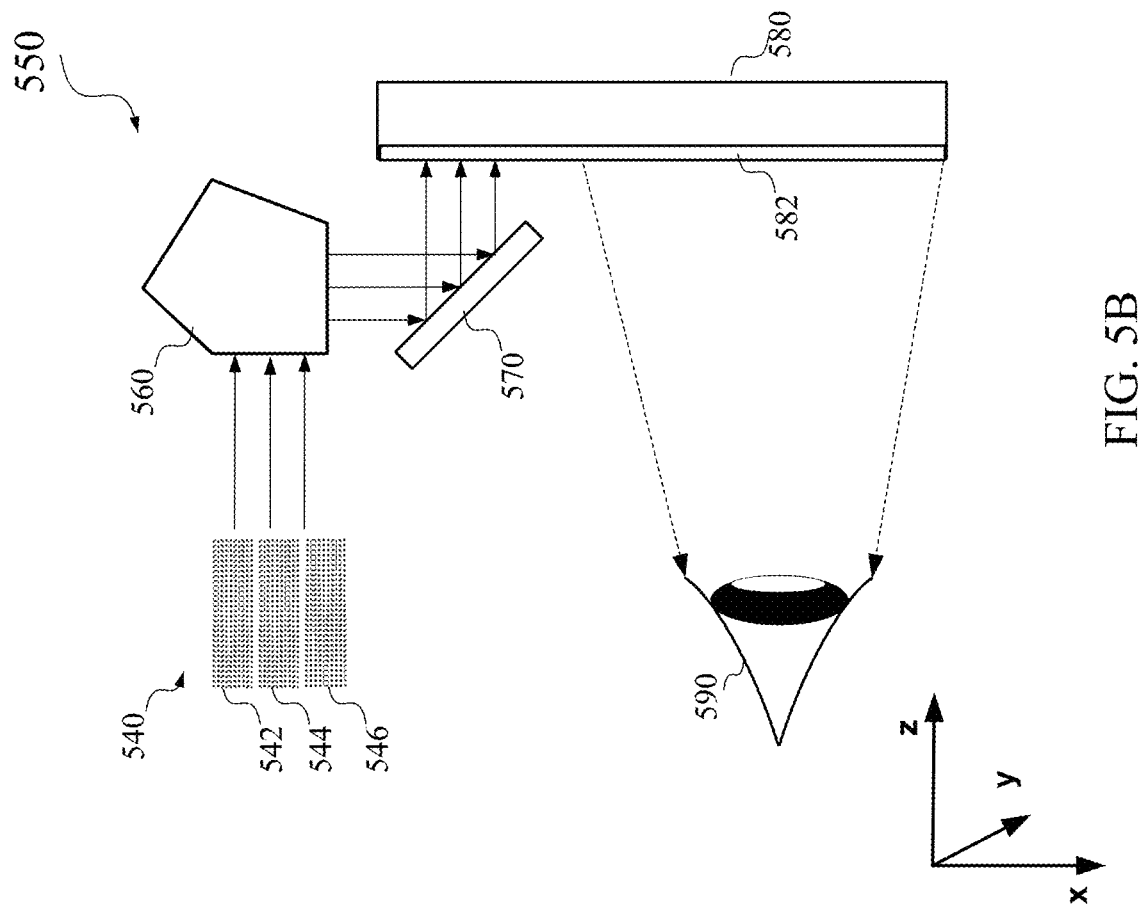
FIG. 5B illustrates an example of a near-eye display device including a waveguide display according to certain embodiments.
Figure 5A:
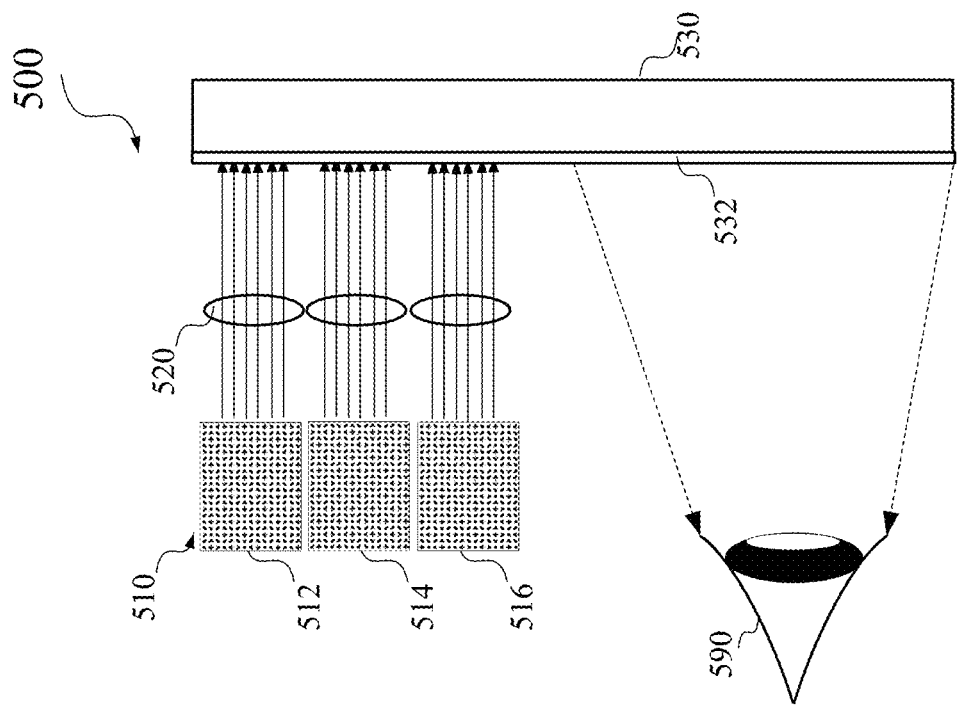
FIG. 5A illustrates an example of a near-eye display device including a waveguide display according to certain embodiments.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
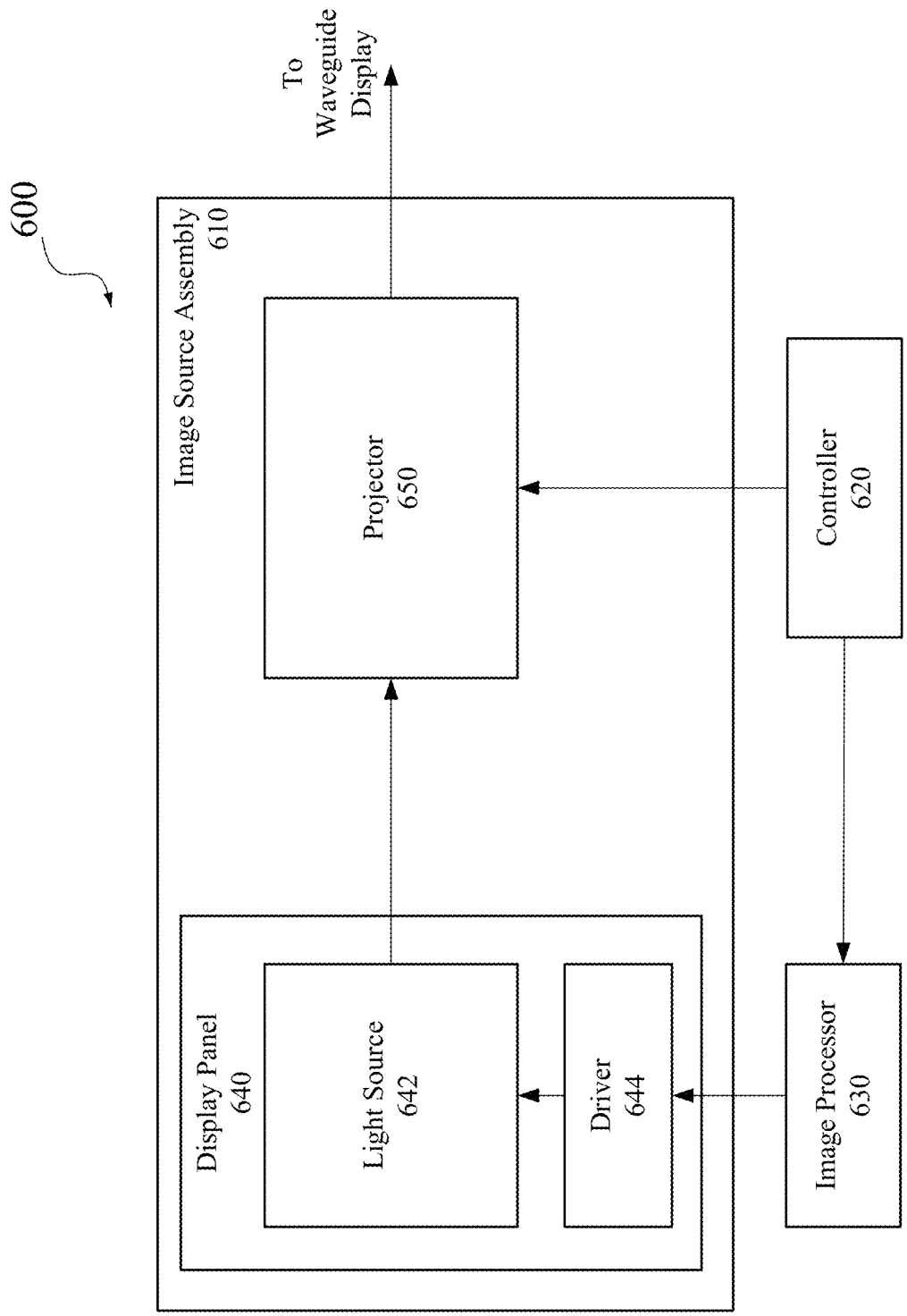
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
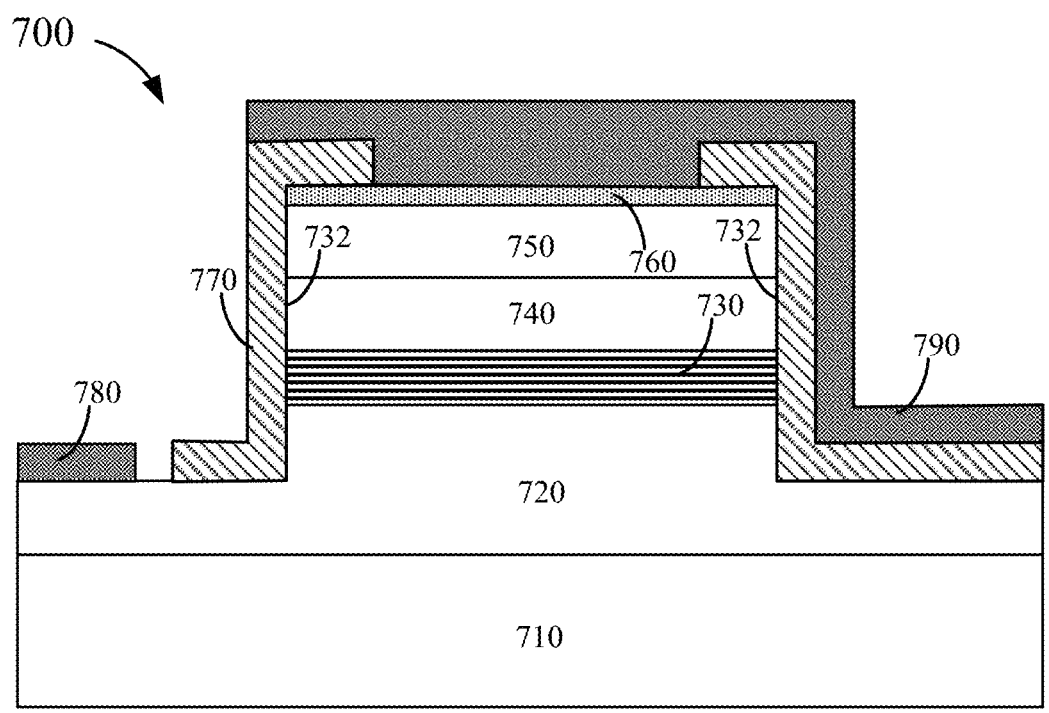
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
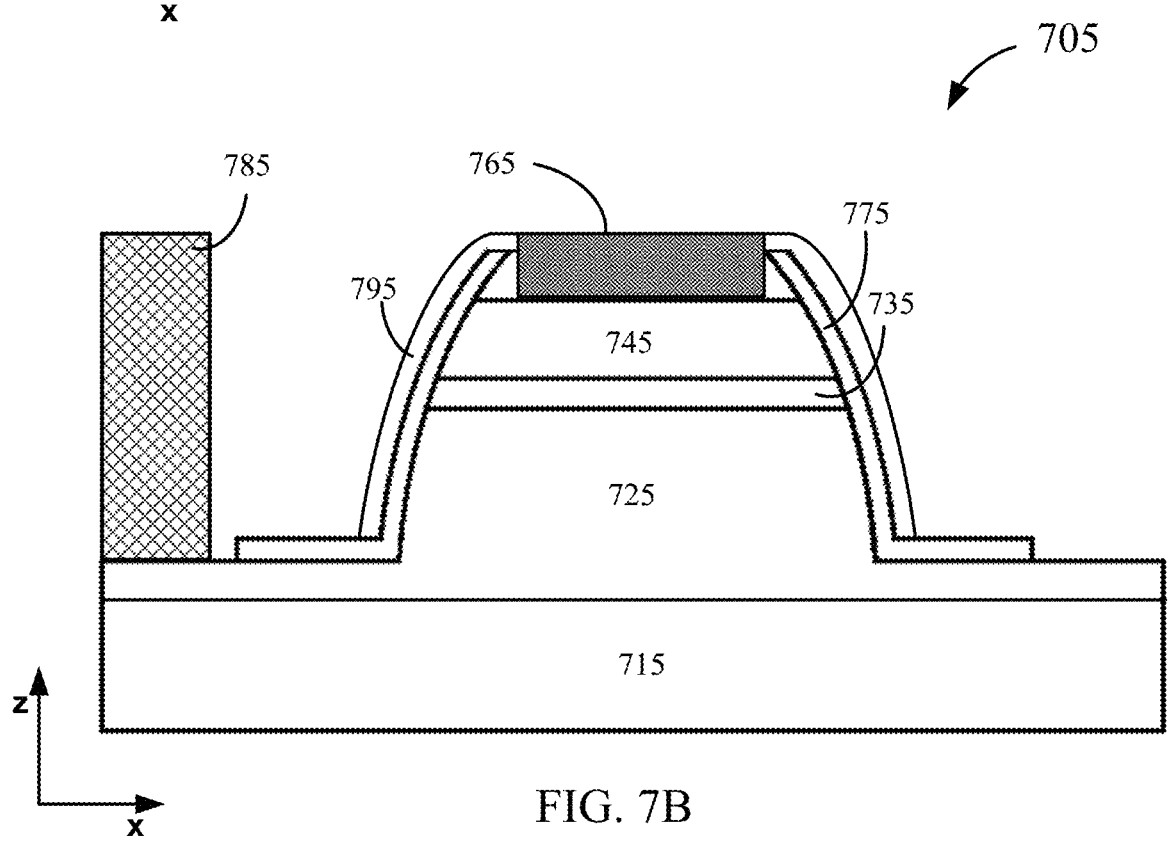
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

FIGS. 8A-8D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 8A shows a substrate 810 with passive or active circuits 820 manufactured thereon. As described above with respect to FIGS. 8A-8B, substrate 810 may include, for example, a silicon wafer. Circuits 820 may include driver circuits for the arrays of LEDs. A bonding layer may include dielectric regions 840 and contact pads 830 connected to circuits 820 through electrical interconnects 822. Contact pads 830 may include, for example, Cu, Ag, Au, Al, W, Mo, Ni, Ti, Pt, Pd, or the like. Dielectric materials in dielectric regions 840 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 805. The activated surface may be atomically clean and may be reactive for formation of direct bonds between wafers when they are brought into contact, for example, at room temperature.

FIG. 8B illustrates a wafer 850 including an array of micro-LEDs 870 fabricated thereon as described above with respect to, for example, FIGS. 7A-8B. Wafer 850 may be a carrier wafer and may include, for example, GaAs, InP, GaN, AlN, sapphire, SiC, Si, or the like. Micro-LEDs 870 may include an n-type layer, an active region, and a p-type layer epitaxially grown on wafer 850. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 880 and n-contacts 882 may be formed in a dielectric material layer 860 deposited on the mesa structures and may make electrical contacts with the p-type layer and the n-type layers, respectively. Dielectric materials in dielectric material layer 860 may include, for example, SiCN, $SiO_2$, SiN, $Al_2O_3$, $HfO_2$, $ZrO_2$, $Ta_2O_5$, or the like. P-contacts 880 and n-contacts 882 may include, for example, Cu, Ag, Au, Al, W, Mo, Ni, Ti, Pt, Pd, or the like. The top surfaces of p-contacts 880, n-contacts 882, and dielectric material layer 860 may form a bonding layer. The bonding layer may be planarized and polished using, for example, chemical mechanical polishing, where the polishing may cause dishing in p-contacts 880 and n-contacts 882. The bonding layer may then be cleaned and activated by, for example, an ion (e.g., plasma) or fast atom (e.g., Ar) beam 815. The activated surface may be atomically clean and reactive for formation of direct bonds between wafers when they are brought into contact, for example, at room temperature.

FIG. 8C illustrates a room temperature bonding process for bonding the dielectric materials in the bonding layers. For example, after the bonding layer that includes dielectric regions 840 and contact pads 830 and the bonding layer that includes p-contacts 880, n-contacts 882, and dielectric material layer 860 are surface activated, wafer 850 and micro-LEDs 870 may be turned upside down and brought into contact with substrate 810 and the circuits formed thereon. In some embodiments, compression pressure 825 may be applied to substrate 810 and wafer 850 such that the bonding layers are pressed against each other. Due to the surface activation and the dishing in the contacts, dielectric regions 840 and dielectric material layer 860 may be in direct contact because of the surface attractive force, and may react and form chemical bonds between them because the surface atoms may have dangling bonds and may be in unstable energy states after the activation. Thus, the dielectric materials in dielectric regions 840 and dielectric material layer 860 may be bonded together with or without heat treatment or pressure.

FIG. 8D illustrates an annealing process for bonding the contacts in the bonding layers after bonding the dielectric materials in the bonding layers. For example, contact pads 830 and p-contacts 880 or n-contacts 882 may be bonded together by annealing at, for example, about 200-400° C. or higher. During the annealing process, heat 835 may cause the contacts to expand more than the dielectric materials (due to different coefficients of thermal expansion), and thus may close the dishing gaps between the contacts such that contact pads 830 and p-contacts 880 or n-contacts 882 may be in contact and may form direct metallic bonds at the activated surfaces.

In some embodiments, after the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 9:
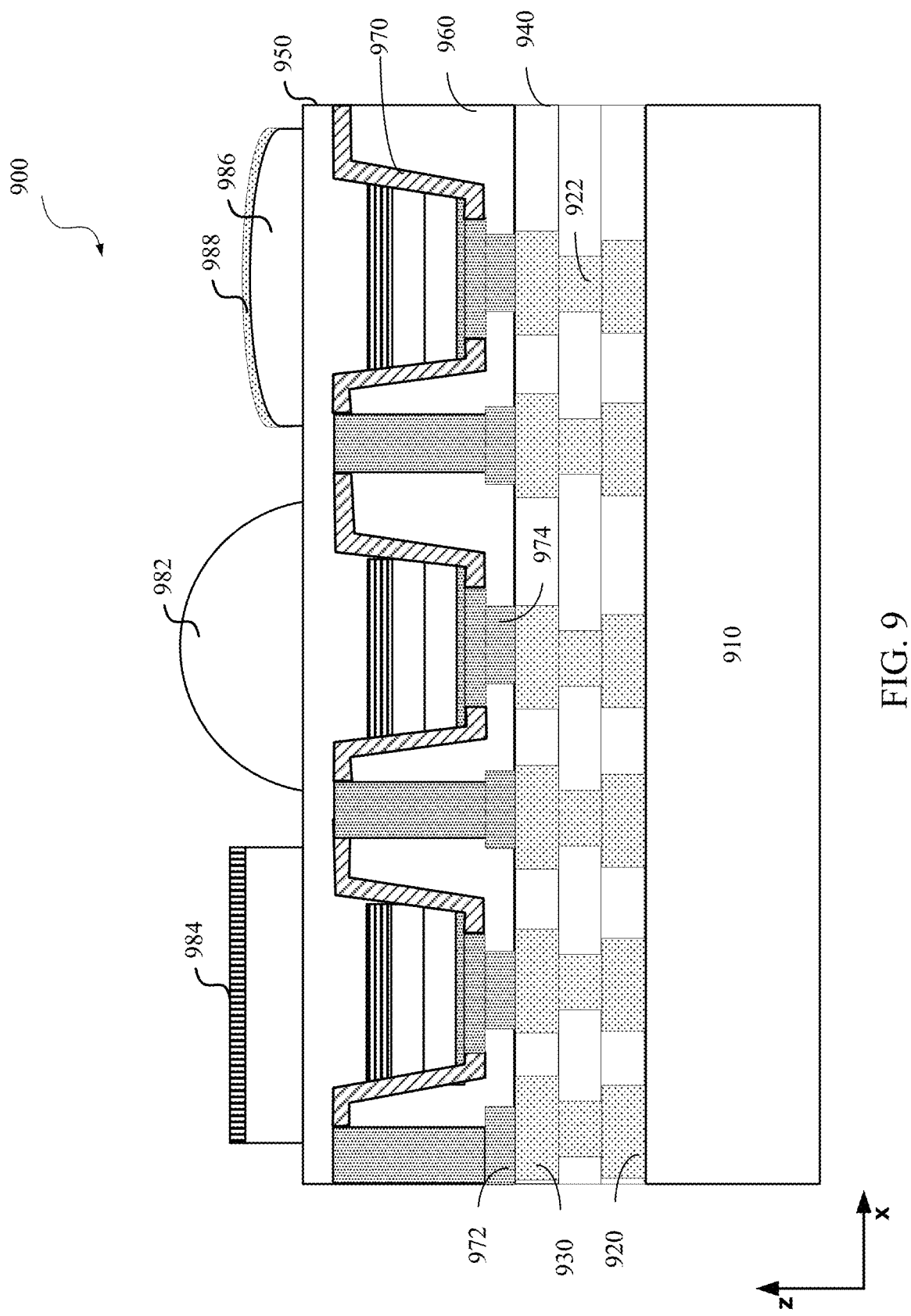
FIG. 9 illustrates an example of an LED array with secondary optical components fabricated thereon according to certain embodiments.

FIG. 9 illustrates an example of an LED array 900 with secondary optical components fabricated thereon according to certain embodiments. LED array 900 may be made by bonding an LED chip or wafer with a silicon wafer including electrical circuits fabricated thereon, using any suitable bonding techniques described above with respect to, for example, FIGS. 8A-9D. In the example shown in FIG. 9, LED array 900 may be bonded using a wafer-to-wafer hybrid bonding technique as described above with respect to FIG. 9A-9D. LED array 900 may include a substrate 910, which may be, for example, a silicon wafer. Integrated circuits 920, such as LED driver circuits, may be fabricated on substrate 910. Integrated circuits 920 may be connected to p-contacts 974 and n-contacts 972 of micro-LEDs 970 through interconnects 922 and contact pads 930, where contact pads 930 may form metallic bonds with p-contacts 974 and n-contacts 972. Dielectric layer 940 on substrate 910 may be bonded to dielectric layer 960 through fusion bonding.

The substrate (not shown) of the LED chip or wafer may be thinned or may be removed to expose the n-type layer 950 of micro-LEDs 970. Various secondary optical components, such as a spherical micro-lens 982, a grating 984, a micro-lens 986, an antireflection layer 988, and the like, may be formed in or on top of n-type layer 950. For example, spherical micro-lens arrays may be etched in the semiconductor materials of micro-LEDs 970 using a gray-scale mask and a photoresist with a linear response to exposure light, or using an etch mask formed by thermal reflowing of a patterned photoresist layer. The secondary optical components may also be etched in a dielectric layer deposited on n-type layer 950 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 970 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 9 to show some examples of secondary optical components that can be formed on micro-LEDs 970, which does not necessary imply that different secondary optical components are used simultaneously for every LED array.

In the processes described above with respect to, for example, FIGS. 8A-9, it can be very challenging to precisely align the bonding pads on the micro-LED devices with the bonding pads on the drive circuits and form reliable bonding at bonding interfaces that may include both dielectric materials (e.g., $SiO_2$) and metal (e.g., Cu) bonding pads. For example, when the pitch of the micro-LED device is about 2 or 3 µm or lower, the bonding pads may have a linear dimension less than about 1 µm (e.g., about 0.7 µm), in order to avoid shorting between adjacent micro-LEDs. However, for small bonding pads, misalignment may reduce the metal-to-metal overlap between the bonding pads, increase the contact resistance (or may even cause an open circuit), and/or cause diffusion of metals into semiconductor materials or dielectric materials (and thus may cause high current leakage).

Figure 10B:
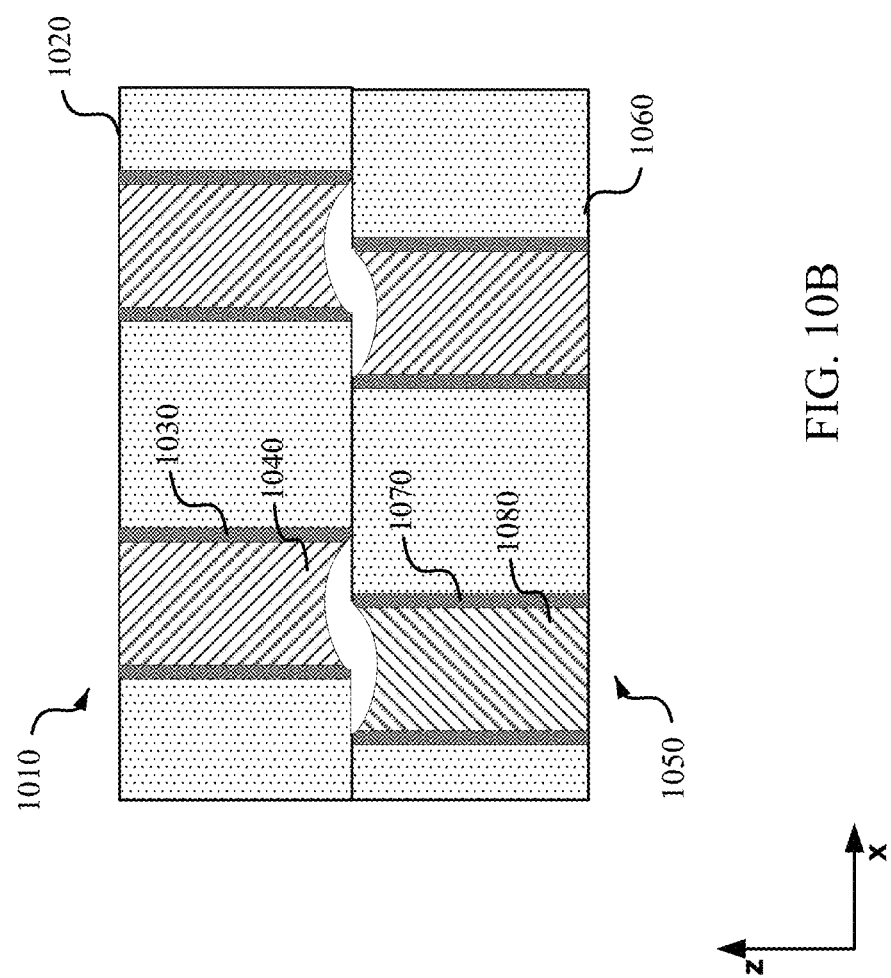
FIG. 10B illustrates an example of a wafer stack formed by hybrid bonding of two wafers, where bonding pads on the two wafers may be misaligned.
Figure 10A:
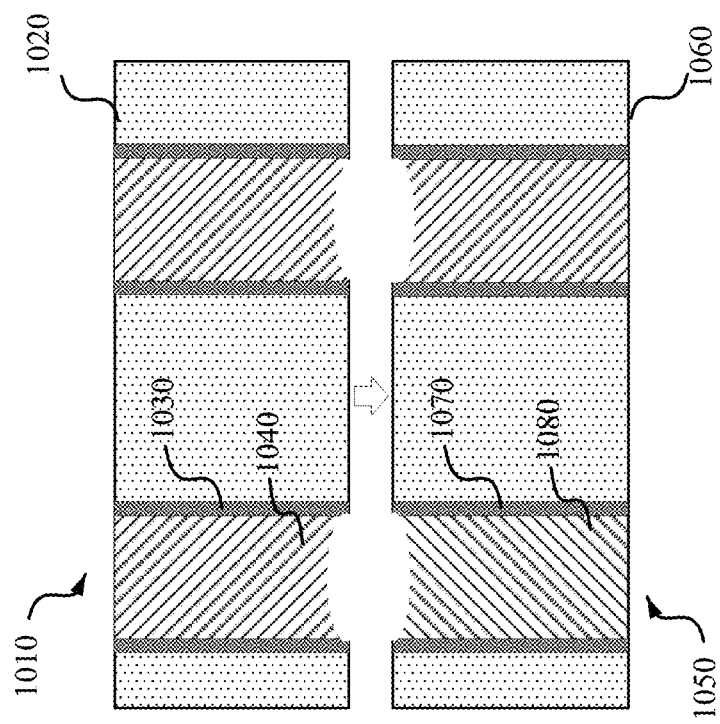
FIG. 10A illustrates an example of hybrid bonding between two wafers or dice.

FIG. 10A illustrates an example of hybrid bonding between two wafers or dice. FIG. 10A shows the bonding layers of two wafers or dice, where a first wafer (e.g., a silicon, GaAs, or sapphire wafer with micro-LEDs fabricated thereon) may include a bonding layer 1010, and a second wafer (e.g., a silicon wafer with pixel drive circuits fabricated thereon) may include a bonding layer 1050. Bonding layer 1010 may include an oxide layer 1020 (e.g., a $SiO_2$ or SiN layer) with bonding pads 1040 (or metal plugs) formed in oxide layer 1020. Bonding layer 1010 may be formed by, for example, depositing oxide layer 1020 on the first wafer, planarizing oxide layer 1020, selectively etching oxide layer 1020 to form trenches in oxide layer 1020, depositing a barrier layer 1030 (e.g., W, Ti, or TiN) on sidewalls of the trenches, depositing a metal layer (e.g., Cu, Au, or Al) to fill the trenches, and removing the metal layer on top of oxide layer 1020 and planarizing the surface of bonding layer 1010 (e.g., using a chemical mechanical planarization (CMP) process). Barrier layer 1030 may be used to reduce or prevent the diffusion of the metal material to other regions that may cause leakage. The metal layer remains in the trenches may form bonding pads 1040. Similarly, bonding layer 1050 may be formed by, for example, depositing oxide layer 1060 on the second wafer, planarizing oxide layer 1060, selectively etching oxide layer 1060 to form trenches in oxide layer 1060, depositing a barrier layer 1070 (e.g., W, Ti, or TiN) on sidewalls of the trenches, depositing a metal (e.g., Cu, Au, or Al) layer to fill the trenches, and removing the metal layer on top of oxide layer 1060 and planarizing the surface of bonding layer 1050 (e.g., using a CMP process). The metal layer remaining in the trenches may form bonding pads 1080. As shown in FIG. 10A, after the planarization, bonding pads 1040 and 1080 may include dishing at the bonding surfaces.

As described above, the bonding surfaces of bonding layers 1010 and 1050 may be conditioned before hybrid bonding. For example, the surfaces of the metal bonding pads (e.g., Cu, Au, or Al pads) may include surface oxide and/or other contamination. Excessive oxidation and/or contamination at the bonding surfaces may drastically decrease the bonding strength and electrical conductivity. Diffusion bonding may be performed in a vacuum or in an inert atmosphere (e.g., dry nitrogen, argon, or helium) to reduce detrimental oxidation or contamination of the bonding surfaces. The bonding layer may be cleaned and activated by, for example, an ion (e.g., plasma) beam or a fast atom (e.g., Ar) beam. Ar sputtering may remove the Cu oxide layer. The activated surface may be atomically clean and reactive for formation of direct bonds between wafers when they are brought into contact, for example, at room temperature. In some embodiments, processes for removing surface oxide layers on the metal using citric acid, oxalic acid, and the like may be performed prior to plasma treatment.

During the hybrid bonding, bonding layers 1010 and 1050 may be brought into contact. In some embodiments, compressive force may be applied to bonding layers 1010 and 1050 such that bonding layers 1010 and 1050 are pressed against each other. Due to the surface activation and the dishing in the bonding pads 1040 and 1080, the oxide of oxide layer 1020 and the oxide of oxide layer 1060 may be in direct contact, and may react and form chemical bonds between them because the surface atoms may have dangling bonds and may be in unstable energy states after the activation. Thus, the oxide of oxide layer 1020 and the oxide of oxide layer 1060 may be bonded together by van der Waals attractions, with or without heat treatment or pressure. An annealing process may then be performed at elevated temperatures. During the annealing, oxide layer 1020 that is in contact with oxide layer 1060 may strengthen the bonds through a two-step condensation reaction to fuse the oxide-oxide interface together. The bonded wafer stack may be further annealed to cause the metal bonding pads to expand such that the dishing may be filled and bonding pads 1040 and 1080 may be in contact to form direct metallic bonds at the activated surfaces.

FIG. 10B illustrates an example of a wafer stack formed by hybrid bonding where bonding pads on the two wafers may be misaligned. As described above, for micro-LED devices with small pitches (e.g., less than about 5 μm, 3 μm, or 2 μm), in order to have sufficiently large oxide areas for strong dielectric bonding of the oxide-oxide interfaces at room temperature, the metal bonding pads may need to be small, such as about one half, one third, or one quarter of the total bond interface area. Precise alignment of the metal bonding pads may be needed to make good electrical connections between bonding pads 1040 and 1080. In the example illustrated in FIG. 10B, bonding pads 1040 and 1080 may be misaligned, and thus the contact region between bonding pads 1040 and 1080 may be smaller than the bonding area of a bonding pad 1040 or a bonding pad 1080. The misalignment may increase the resistance at the bonding interface. In some cases, the bonding pads are small and the misalignment may be large at least in some regions. Thus, some bonding pads on a wafer may not be in contact with corresponding bonding pads on the other wafer, and therefore some micro-LED electrodes may not be connected to the drive circuits. In addition, due to the misalignment, the metal material of bonding pads 1040 and 1080 may be in direct contact with the oxide material of the bonding layers, and thus may diffuse into the oxide material and may cause leakage current between bonding pads of adjacent micro-LEDs. Furthermore, annealing at an elevated temperature to cause the metal bonding pads to expand and form a metal connection may cause large wafer bowing due to, for example, the different thermal expansion coefficients of the different materials, such as Si substrate of the CMOS backplane and GaAs (or sapphire) substrate of the micro-LED wafer. The wafer bowing may create defects in or damages to the bonded wafer stack, such as high stress, cracks, delamination, crystal dislocation slip (glide), cratering, and the like. The annealing process may also need to be controlled such that the metal bonding pads may expand by an appropriate amount to fill the voids caused by the dishing and may not expand too much to cause dielectric delamination at the dielectric-dielectric bonding interface.

Figures 11A, 11B:
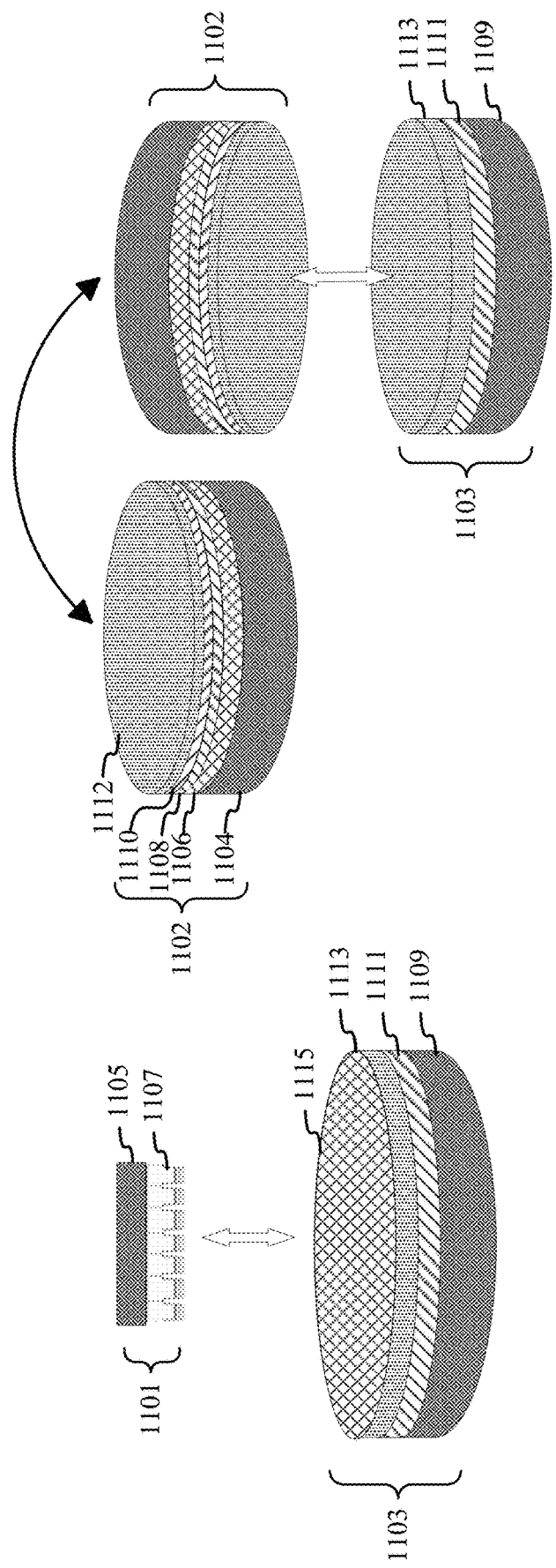
FIG. 11A illustrates an example of a method of die-to-wafer bonding for arrays of LEDs according to certain embodiments.
FIG. 11B illustrates an example of a method of wafer-to-wafer bonding for arrays of LEDs according to certain embodiments.

FIG. 11A illustrates an example of a method of die-to-wafer bonding for arrays of LEDs according to certain embodiments. In the example shown in FIG. 11A, an LED array 1101 may include a plurality of LEDs 1107 on a carrier substrate 1105. Carrier substrate 1105 may include various materials, such as GaAs, InP, GaN, AlN, sapphire, SiC, Si, or the like. LEDs 1107 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 1103 may include a base layer 1109 having passive or active integrated circuits (e.g., drive circuits 1111) fabricated thereon. Base layer 1109 may include, for example, a silicon wafer. Drive circuits 1111 may be used to control the operations of LEDs 1107. For example, the drive circuit for each LED 1107 may include a 2T1C pixel structure that has two transistors and one capacitor. Wafer 1103 may also include a bonding layer 1113. Bonding layer 1113 may include various materials, such as a metal, an oxide, a dielectric, CuSn, AuTi, and the like. In some embodiments, a patterned layer 1115 may be formed on a surface of bonding layer 1113, where patterned layer 1115 may include a metallic grid made of a conductive material, such as Cu, Ag, Au, Al, or the like.

LED array 1101 may be bonded to wafer 1103 via bonding layer 1113 or patterned layer 1115. For example, patterned layer 1115 may include metal pads or bumps made of various materials, such as CuSn, AuSn, or nanoporous Au, that may be used to align LEDs 1107 of LED array 1101 with corresponding drive circuits 1111 on wafer 1103. In one example, LED array 1101 may be brought toward wafer 1103 until LEDs 1107 come into contact with respective metal pads or bumps corresponding to drive circuits 1111. Some or all of LEDs 1107 may be aligned with drive circuits 1111, and may then be bonded to wafer 1103 via patterned layer 1115 by various bonding techniques, such as metal-to-metal bonding. After LEDs 1107 have been bonded to wafer 1103, carrier substrate 1105 may be removed from LEDs 1107.

In some implementations, to avoid precise alignment for the bonding, a micro-LED wafer may be bonded to a CMOS backplane after the epitaxial layer growth and before the formation of individual micro-LED on the micro-LED wafer, where the micro-LED wafer and the CMOS backplane may be bonded through metal-to-metal bonding of two solid metal bonding layers on the two wafers. No alignment would be needed to bond the solid contiguous metal bonding layers. After the bonding, the epitaxial layers on the micro-LED wafer and the metal bonding layers may be etched to form individual micro-LEDs. The etching process may have much higher alignment accuracy and thus may form individual micro-LEDs that align with the underlying pixel drive circuits.

FIG. 11B illustrates an example of a method of wafer-to-wafer bonding for arrays of LEDs according to certain embodiments. As shown in FIG. 11B, a first wafer 1102 may include a substrate 1104, a first semiconductor layer 1106, active layers 1108, and a second semiconductor layer 1110. Substrate 1104 may include various materials, such as GaAs, InP, GaN, AlN, sapphire, SiC, Si, or the like. First semiconductor layer 1106, active layers 1108, and second semiconductor layer 1110 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 1106 may be an n-type layer, and second semiconductor layer 1110 may be a p-type layer. For example, first semiconductor layer 1106 may be an n-doped GaN layer (e.g., doped with Si or Ge), and second semiconductor layer 1110 may be a p-doped GaN layer (e.g., doped with Mg, Ca, Zn, or Be). Active layers 1108 may include, for example, one or more GaN layers, one or more InGaN layers, one or more AlInGaP layers, and the like, which may form one or more heterostructures, such as one or more quantum wells or MQWs.

In some embodiments, first wafer 1102 may also include a bonding layer. Bonding layer 1112 may include various materials, such as a metal, an oxide, a dielectric, CuSn, AuTi, or the like. In one example, bonding layer 1112 may include p-contacts and/or n-contacts (not shown). In some embodiments, other layers may also be included on first wafer 1102, such as a buffer layer between substrate 1104 and first semiconductor layer 1106. The buffer layer may include various materials, such as polycrystalline GaN or AlN. In some embodiments, a contact layer may be between second semiconductor layer 1110 and bonding layer 1112. The contact layer may include any suitable material for providing an electrical contact to second semiconductor layer 1110 and/or first semiconductor layer 1106.

First wafer 1102 may be bonded to wafer 1103 that includes drive circuits 1111 and bonding layer 1113 as described above, via bonding layer 1113 and/or bonding layer 1112. Bonding layer 1112 and bonding layer 1113 may be made of the same material or different materials. Bonding layer 1113 and bonding layer 1112 may be substantially flat. First wafer 1102 may be bonded to wafer 1103 by various methods, such as metal-to-metal bonding, eutectic bonding, metal oxide bonding, anodic bonding, thermo-compression bonding, ultraviolet (UV) bonding, and/or fusion bonding.

As shown in FIG. 11B, first wafer 1102 may be bonded to wafer 1103 with the p-side (e.g., second semiconductor layer 1110) of first wafer 1102 facing down (i.e., toward wafer 1103). After bonding, substrate 1104 may be removed from first wafer 1102, and first wafer 1102 may then be processed from the n-side. The processing may include, for example, the formation of certain mesa shapes for individual LEDs, as well as the formation of optical components corresponding to the individual LEDs.

FIGS. 12A-12F illustrate an example of a method of fabricating a micro-LED device using alignment-free metal-to-metal bonding and post-bonding mesa formation. FIG. 12A shows a micro-LED wafer 1202 including epitaxial layers grown on a substrate 1210. As described above, substrate 1210 may include, for example, a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane (e.g., c-plane or a semipolar plane) as the growth surface. In some embodiments, a buffer layer 1212 may be formed on substrate 1210 to improve the lattice matching of the epitaxial layers, thereby reducing stress and defects in the epitaxial layers. The epitaxial layers may include an n-type semiconductor layer 1214 (e.g., a GaN layer doped with Si or Ge), an active region 1216, and a p-type semiconductor layer 1218 (e.g., a GaN layer with Mg, Ca, Zn, or Be). Active region 1216 may include multiple quantum wells or an MQW formed by quantum well layers (e.g., InGaN layer) sandwiched by barrier layers (e.g., GaN layer) as described above. The epitaxial layers may be grown layer-by-layer on substrate 1210 or buffer layer 1212 using techniques such as VPE, LPE, MBE, or MOCVD.

In epitaxial growth processes, dopants (e.g., Mg) used to dope the p-type semiconductor layer (e.g., Mg-doped GaN layer) may remain in the reactor and/or on the epitaxial surface after the introduction of Mg precursors into the reactor. For example, the source for Mg doping (e.g., bis (cyclopentadienyl) magnesium (Cp$_2$Mg)) may be adsorbed onto reactor lines and walls and may be released in the gas phase in subsequent processes. A surface riding effect can also contribute to the residual Mg due to a Mg-rich layer formed on the surface of the p-GaN layer. Thus, if the quantum-well layers are grown on the Mg-rich p-GaN layer after the growth of the p-GaN layer using Mg dopants, the quantum-well layers may be contaminated with Mg dopants even after the Mg source is turned off, which may be referred to as the Mg-memory effect and may manifest as a slow decay tail of Mg into subsequent epitaxial layers. Mg can contaminate the MQW layers to form non-radiative recombination centers, which may be caused by Mg-related point defects, Mg interstitials, or Mg-related complexes.

In addition, for p-type GaN layers formed using, for example, MOCVD, the dopants (e.g., Mg) may be passivated due to the incorporation of atomic hydrogen (which exists in the form of H$^+$) during growth and the formation of Mg—H complexes. Therefore, a post-growth activation of the dopants is generally performed to release mobile holes. The activation of the dopants in the p-GaN layer may include breaking the Mg—H bonds and driving the H$^+$ out of the p-GaN layer at elevated temperatures (e.g., above 700° C.) to activate the Mg dopants. Insufficient activation of the p-GaN layer may lead to an open circuit, a poor performance, or a premature punch-through breakdown of the LED device. If p-type GaN layer is grown before the growth of the active region and the n-type layer, to drive out hydrogen, positively charged H$^+$ ions need to diffuse across the p-n junction and through the n-GaN layer that is exposed. However, because of the depletion field in the p-n junction (with a direction from the n-type layer to the p-type layer), positively charged H$^+$ ions may not be able to diffuse from the p-type region to the n-type region across the p-n junction. In addition, hydrogen may have a much higher diffusion barrier and thus a much lower diffusivity in n-type GaN compared with in p-type GaN. Thus, the hydrogen ions may not diffuse through the n-type layer to the exposed top surface of the n-type layer. In addition, the activation may not be performed right after the p-doping and before the growth of the active region either, because the subsequent growth may be performed in the presence of high pressure ammonia (NH$_3$) in order to avoid decomposition of GaN at the high growth temperatures, and thus a semiconductor layer (e.g., the p-type semiconductor layer) that was activated may be re-passivated due to the presence of ammonia.

Therefore, in general, during the growth of the epitaxial layers, n-type semiconductor layer 1214 may be grown first. P-type semiconductor layer 1218 may be grown after the growth of active region 1216 to avoid contamination of active region 1216 and facilitate activation of the dopants in the p-type semiconductor layer.

FIG. 12B shows a reflector layer 1220 and a bonding layer 1222 formed on p-type semiconductor layer 1218. Reflector layer 1220 may include, for example, a metal layer such as an aluminum layer, a silver layer, or a metal alloy layer, or a distributed Bragg reflector formed by conductive materials (e.g., semiconductor materials) or including conductive vias. Reflector layer 1220 may include one or more sublayers. Reflector layer 1220 may be deposited on p-type semiconductor layer 1218 in a deposition process. Bonding layer 1222 may include a metal layer, such as a titanium layer, a copper layer, an aluminum layer, a gold layer, or a metal alloy layer. In some embodiments, bonding layer 1222 may include a eutectic alloy, such as Au—In, Au—Sn, Au—Ge, or Ag—In. Bonding layer 1222 may be formed on reflector layer 1220 by a deposition process and may include one or more sublayers.

FIG. 12C shows a backplane wafer 1204 that includes a substrate 1230 with electrical circuits formed thereon. The electrical circuits may include digital and analog pixel drive circuits for driving individual micro-LEDs. A plurality of metal pads 1234 (e.g., copper pads) may be formed in a dielectric layer 1232 (e.g., SiO$_2$ or SiN). In some embodiments, each metal pad 1234 may be an electrode (e.g., anode) for a micro-LED. In some embodiments, pixel drive circuits for each micro-LED may be formed in an area matching the size of a micro-LED (e.g., about 2 μm×2 μm), where the pixel drive circuits and the micro-LED may collectively form a pixel of a micro-LED display panel. Even though FIG. 12C only shows metal pads 1234 formed in one metal layer in one dielectric layer 1232, backplane wafer 1204 may include two or more metal layers formed in dielectric materials and interconnected by, for example, metal vias, as in many CMOS integrated circuits. In some embodiments, a planarization process, such as a CMP process, may be performed to planarize the exposed surfaces of metal pads 1234 and dielectric layer 1232. A bonding layer 1240 may be formed on dielectric layer 1232 and may be in physical and electrical contact with metal pads 1234. As bonding layer 1222, bonding layer 1240 may include a metal layer, such as a titanium layer, a copper layer, an aluminum layer, a gold layer, or a metal alloy layer. In some embodiments, bonding layer 1240 may include a eutectic alloy. In some embodiments, only one of bonding layer 1240 or bonding layer 1222 may be used.

FIG. 12D shows that micro-LED wafer 1202 and backplane wafer 1204 may be bonded together to form a wafer stack 1206. Micro-LED wafer 1202 and backplane wafer 1204 may be bonded by the metal-to-metal bonding of bonding layer 1222 and bonding layer 1240. As described above, the metal-to-metal bonding may be based on chemical bonds between the metal atoms at the surfaces of the metal bonding layers. The metal-to-metal bonding may include, for example, thermo-compression bonding, eutectic bonding, or transient liquid phase (TLP) bonding. The metal-to-metal bonding process may include, for example, surface planarization, wafer cleaning (e.g., using plasma or solvents) at room temperature, and compression and annealing at elevated temperatures, such as about 250° C. or higher, to cause diffusion of atoms. In eutectic bonding, a eutectic alloy including two or more metals and with a eutectic point lower than the melting point of the one or more metals may be used for low-temperature wafer bonding. Because the eutectic alloy may become a liquid at the elevated temperature, eutectic bonding may be less sensitive to surface flatness irregularities, scratches, particles contamination, and the like. After the bonding, buffer layer 1212 and substrate 1210 may be thinned or removed by, for example, etching, back grinding, or laser lifting, to expose n-type semiconductor layer 1214.

FIG. 12E shows that wafer stack 1206 may be etched from the side of the exposed n-type semiconductor layer 1214 to form mesa structures 1208 for individual micro-LEDs. As shown in FIG. 12E, the etching may include etching through n-type semiconductor layer 1214, active region 1216, p-type semiconductor layer 1218, reflector layer 1220, and bonding layers 1222 and 1240, in order to singulate and electrically isolate mesa structures 1208. Thus, each singulated mesa structure 1208 may include n-type semiconductor layer 1214, active region 1216, p-type semiconductor layer 1218, reflector layer 1220, and bonding layers 1222 and 1240. To perform the selected etching, an etch mask layer may be formed on n-type semiconductor layer 1214. The etch mask layer may be patterned by aligning a photomask with the backplane wafer (e.g., using alignment marks on backplane wafer 1204) such that the patterned etch mask formed in the etch mask layer may align with metal pads 1234. Therefore, regions of the epitaxial layers and bonding layers above metal pads 1234 may not be etched. Dielectric layer 1232 may be used as the etch-stop layer for the etching. Even though FIG. 12E shows that mesa structures 1208 have vertical sidewalls, mesa structures 1208 may have other shapes as described above, such as a conical shape, a parabolic shape, or a truncated pyramid shape.

FIG. 12F shows that a passivation layer 1250 may be formed on sidewalls of mesa structures 1208, and a sidewall reflector layer 1252 may be formed on passivation layer 1250. Passivation layer 1250 may include a dielectric layer (e.g., SiO$_2$ or SiN) or an undoped semiconductor layer. Sidewall reflector layer 1252 may include, for example, a metal (e.g., Al) or a metal alloy. In some embodiments, gaps between mesa structures 1208 may be filled with a dielectric material 1254. Passivation layer 1250, sidewall reflector layer 1252, and/or dielectric material 1254 may be formed using suitable deposition techniques, such as chemical vapor deposition (CVD), physical vapor deposition (PVD), plasma-enhanced chemical vapor deposition (PECVD), atomic-layer deposition (ALD), laser metal deposition (LMD), or sputtering. In some embodiments, sidewall reflector layer 1252 may fill the gaps between mesa structures 1208. In some embodiments, a planarization process may be performed after the deposition of passivation layer 1250, sidewall reflector layer 1252, and/or dielectric material 1254. A common electrode layer 1260, such as a transparent conductive oxide (TCO) layer (e.g., an ITO layer) or a thin metal layer that may be transparent to light emitted in active region 1216, may be formed on the n-type semiconductor layer 1214 to form n-contacts and a common cathode for the micro-LEDs.

Figure 13:
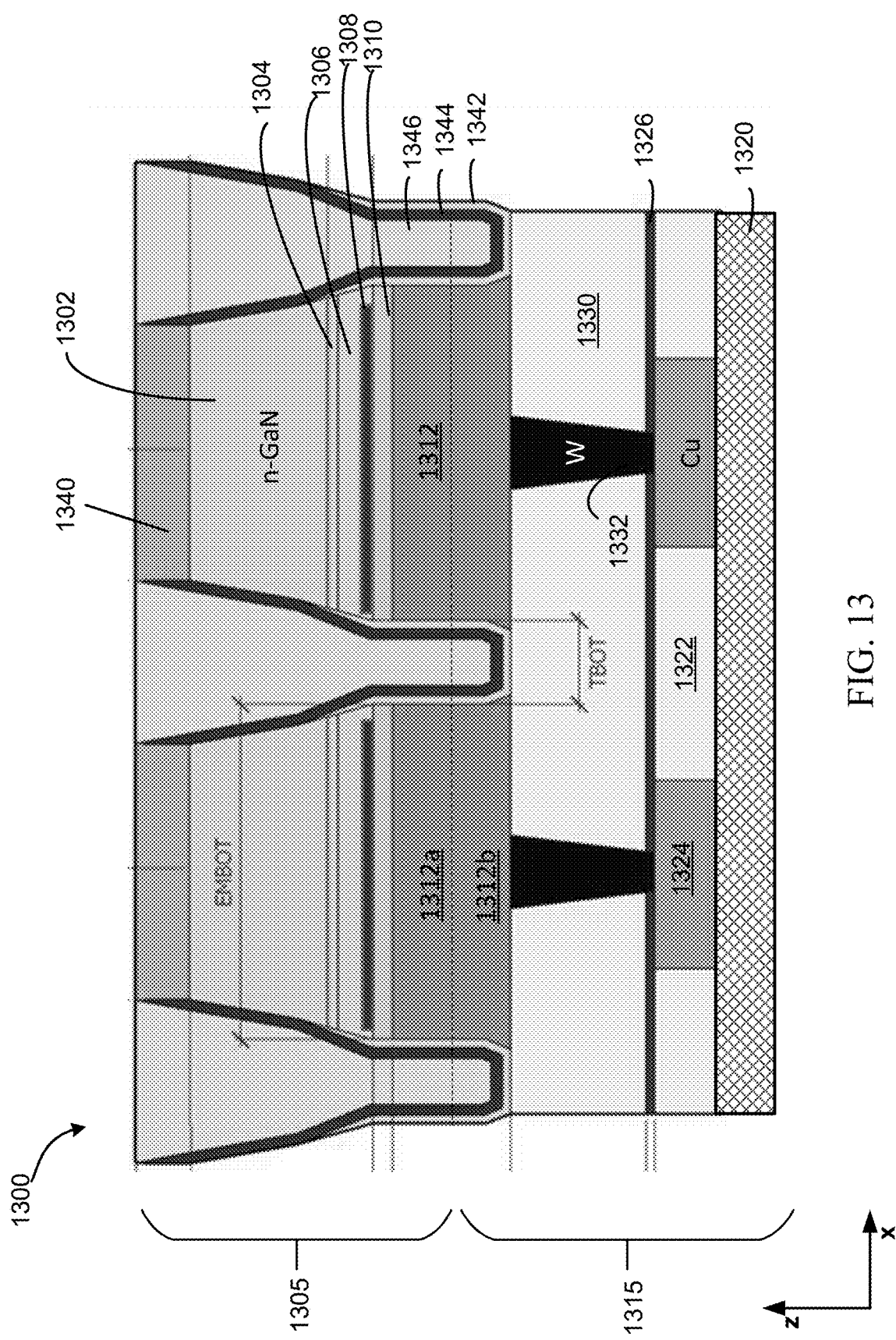
FIG. 13 illustrates an example of a micro-LED device fabricated using the method shown in FIGS. 12A-12F.

FIG. 13 illustrates an example of a micro-LED device fabricated using the method shown in FIGS. 12A-12F. The micro-LED device may include an array of micro-LEDs 1300. A cross-sectional view of the array of micro-LEDs 1300 is shown in FIG. 13. In the illustrated example, each micro-LED of the array of micro-LEDs 1300 may include a mesa structure that includes an n-type semiconductor layer 1302 (e.g., an n-GaN layer), an active region 1304 (e.g., an MQW), a p-type semiconductor layer 1306 (e.g., a p-GaN layer), a p-contact layer 1308 (which may also function as a back reflector and may include, e.g., Al, Ag, Ni, Au, or Cu), a barrier layer 1310 (e.g., a TiN layer), and one or more metal bonding layers 1312 (e.g., including Ti, Ni, TiN, or Cu layers). N-type semiconductor layer 1302 may be much thicker than active region 1304 and p-type semiconductor layer 1306. The one or more metal bonding layers 1312 may include a first metal bonding layer 1312*a* formed on a micro-LED wafer 1305 and a second metal bonding layer 1312*b* formed on a backplane wafer 1315. The array of micro-LEDs 1300 may include a transparent conductive layer 1340 (e.g., including a transparent conductive oxide such as ITO) formed on n-type semiconductor layer 1302. Transparent conductive layer 1340 may form a common cathode for the array of micro-LEDs 1300. A passivation layer 1342 and a reflective material layer 1344 (e.g., Al, Cu, or Au) may be deposited on sidewalls of the mesa structures to form sidewall reflectors that optically isolate individual micro-LEDS. A dielectric material or a metal material (e.g., Au or Cu) 1346 may be deposited in gaps between the mesa structures.

Backplane wafer 1315 may include a substrate 1320 (e.g., a silicon substrate) including pixel drive circuits formed thereon. The pixel drive circuit may include CMOS circuits, such as CMOS transistors. Backplane wafer 1315 may also include one or more dielectric layers 1322 and 1330 (e.g., $SiO_2$ or SiN layers) and metal interconnects formed therein, such as metal (e.g., copper) interconnects 1324 formed in dielectric layer 1322 and tungsten plugs 1332 formed in dielectric layer 1330. One or more etch stop layers 1326 may be between two or more dielectric layers 1322 and 1330 such that etching a dielectric layer to form vias in the dielectric layer may not etch into another dielectric layer or metal interconnects formed in another dielectric layer.

As shown in the illustrated example, n-type semiconductor layer 1302 may be closer to the light emitting surface (the side of transparent conductive layer 1340), while active region 1304 may be at the bottom of the mesa structure further away from the light emitting surface of the micro-LEDs and may be near metal bonding layer 1312. In addition, the mesa structures etched from the side of n-type semiconductor layer 1302 may have inwardly tilted sidewalls. Thus, the efficiency of extracting the light emitted in active region 1304 out of the micro-LED may be low.

Furthermore, as described above, metal bonding layers 1312 may be etched at the end of a deep etching process that forms the mesa structures. Thus, during the etching of these metal-containing layers, metal materials etched from these layers may be redeposited or otherwise formed on the sidewalls of active region 1304. Metal materials redeposited on the sidewalls of active region 1304 may diffuse into active region 1304 to form defects in active region 1304. The defects may become non-radiative recombination centers and thus may reduce the quantum efficiency of the micro-LEDs. As a result, the external quantum efficiency and the reliability of the micro-LED may be reduced.

As also described above, the highly reflective metal (e.g., aluminum or silver) layer that forms the back reflector for redirecting generated photons towards the light emitting surface of the LED may diffuse into semiconductor material layers and/or dielectric layers at a high diffusion rate, and thus may cause a large leakage current. To reduce the metal diffusion and the leakage current, a conductive barrier layer (e.g., a capping metal layer) having a low diffusion rate (e.g., a titanium, tungsten, and/or TiN layer) may be formed around the reflective metal layer. A dielectric layer may be formed on the barrier layer to provide additional isolation. For an LED array with a small pitch, such as less than about 4 μm, less than about 3 μm, or less than about 2 μm, the linear lateral dimension of each LED may be less than about 3 μm, less than about 2 μm, less than about 1.5 μm, or even less than about 1.0 μm. When the pitch of the LED array and the linear lateral dimension of each LED is reduced, the lateral size of the reflective metal layer may need to be reduced more in order to leave sufficient room for the barrier layer and the dielectric layer at the sidewalls of the reflective metal layer to maintain a low leakage. As such, the lateral dimensions of the reflective metal layer and the barrier layer may be very small, thus leaving very little margin for alignment error during the subsequent fabrication processes. Reducing the size of the reflective metal layer may also reduce the overall reflectivity of the back reflector, and thus may reduce the efficiency of the LEDs.

Figure 14A:
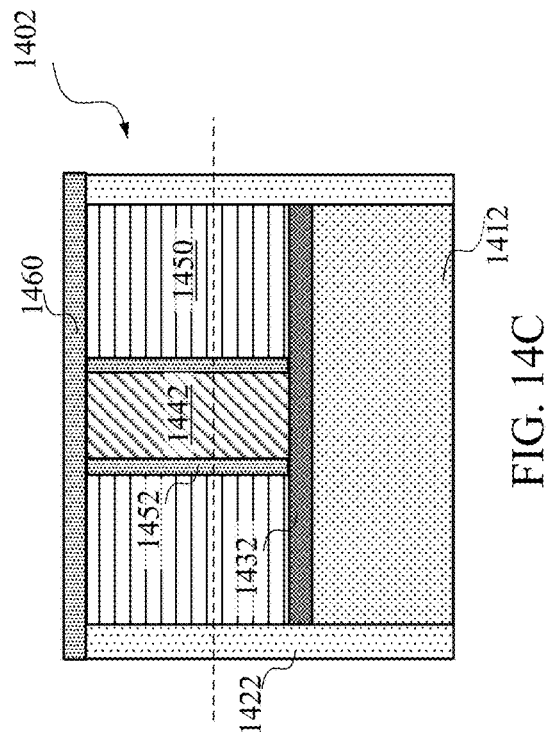
FIGS. 14A and 14B illustrate cross-sectional views of an example of a micro-LED including a metal reflector.
Figure 14C:
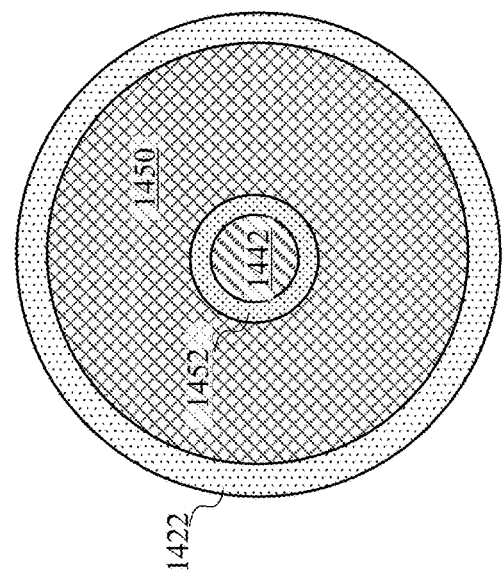
FIGS. 14C and 14D illustrate cross-sectional views of an example of a small micro-LED including a distributed Bragg reflector (DBR) as a back reflector according to certain embodiments.
Figure 14B:
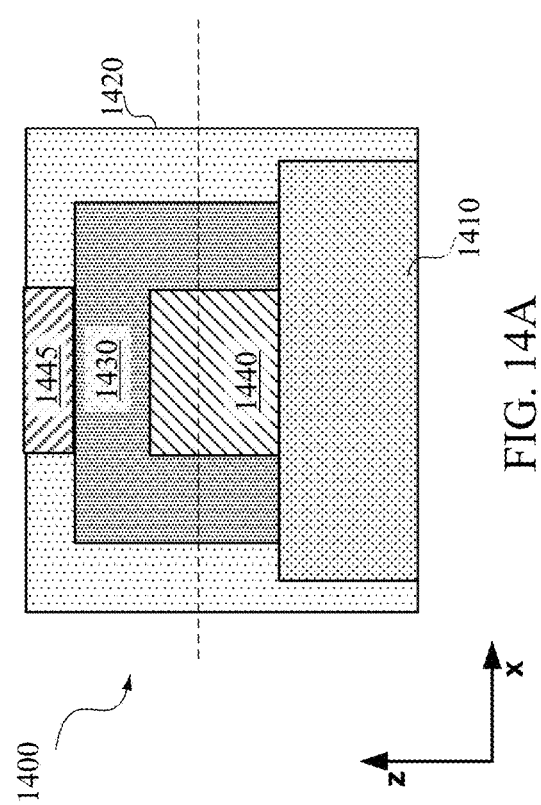

FIGS. 14A and 14B illustrate cross-sectional views of a simplified example of a micro-LED 1400 including a metal (e.g., Ag) back reflector 1440. Metal back reflector 1440 may act as both a p-contact (or n-contact) and a back reflector. Micro-LED 1400 may include epitaxial layers 1410 that are etched to form a mesa structure. Epitaxial layers 1410 may include an n-type semiconductor layer, an active region, and a p-type semiconductor layer. Only a portion of the epitaxial layers (e.g., the p-type semiconductor layer) is shown in FIG. 14A.

Metal back reflector 1440 may be formed on epitaxial layers 1410 and may include a material that may have high electrical conductivity and high optical reflectivity, such as silver, aluminum, or other suitable metals or metal alloys. In one example, metal back reflector 1440 may include silver due to its high reflectivity and high conductance. However, silver may have a high rate of diffusion into semiconductor layers (e.g., the InGaN/GaN layers) at the mesa sidewall regions. Thus, a high leakage current may occur at the sidewall regions of the mesa structure. To reduce the silver diffusion into the semiconductor layers and thus the leakage current, a barrier layer 1430 (also referred to as a capping metal layer) may be formed on the top and sidewalls of metal back reflector 1440. Barrier layer 1430 may also be conductive in order to connect metal back reflector 1440 to the pixel drive circuit. Barrier layer 1430 may include, for example, titanium, tungsten, TiN, and the like. Barrier layer 1430 may need to have a certain thickness in order to reduce the diffusion of silver into the semiconductor layers. A dielectric layer 1420 may be deposited on the top and sidewall regions of the mesa structure to provide additional isolation. Barrier layer 1430 can be used as an etch stop layer to etch a via in dielectric layer 1420, where the via may be filled with a bonding material to form a metal plug 1445. The bonding material may include a metal, such as copper, for bonding micro-LED 1400 to a wafer or die that includes pixel drive circuits fabricated thereon as described above.

For a micro-LED array with a small pitch, such as less than about 4 μm or less than about 3 μm, the linear lateral dimension (e.g., a diameter) of the mesa structure may be less than about 2 μm, such as less than about 1.4 μm. As such, the lateral size of metal back reflector 1440 and the width of barrier layer 1430 at the sidewalls of metal back reflector 1440 may need to be reduced. However, barrier layer 1430 may need to have a certain thickness in order to reduce the current leakage at the edges of the mesa structure. In addition, dielectric layer 1420 may also need to use some regions of the mesa structure. Therefore, when the pitch of the micro-LED array is reduced, the lateral size of metal back reflector 1440 may need to be reduced more in order to leave sufficient room for barrier layer 1430 and dielectric layer 1420 at the sidewalls of metal back reflector 1440 to maintain a low leakage. In some embodiments, the lateral size of metal back reflector 1440 may need to be reduced to less than about 80% or less than about 60% of the lateral size of the active region or the mesa structure. Reducing the size of metal back reflector 1440 for the p-contact may increase the resistance of the p-contact and decrease the reflectivity at the side of the p-type semiconductor layer of micro-LED 1400, thereby reducing the external quantum efficiency of micro-LED 1400. In one example, the lateral size of the mesa structure may be about 1.4 μm, the lateral size of metal back reflector 1440 may need to be reduced to about 0.8 μm or smaller, and the reflectivity of metal back reflector 1440 may be only about 14%.

In addition, when the lateral dimensions of metal back reflector 1440 and barrier layer 1430 are small (e.g., less than 1 μm, such as about 0.8 μm or smaller), there may be very little margin for alignment error during the subsequent fabrication processes. For example, the process of opening the aperture in dielectric layer 1420 to form metal plug 1445 for making electrical contact with metal layer 1440 via barrier layer 1430 may reach the lithographic limit and may need very precise alignment, since the lateral size of the aperture (and metal plug 1445) may need to be smaller than the lateral size of barrier layer 1430.

According to certain embodiments, a micro-LED device may be fabricated by (1) processing from a first side (e.g., p-side) of the epitaxial layers of a micro-LED wafer to form individual mesa structures and a solid metal bonding layer; (2) alignment error-tolerant bonding of a backplane wafer to the solid metal bonding layer of the micro-LED wafer; and (3) removing the substrate of the micro-LED wafer and processing from a second side (e.g., n-side) of the epitaxial layers to isolate the solid metal bonding layer (thereby forming individual electrodes (e.g., anodes) for individual micro-LEDs) and form other structures (e.g., a common electrode such as a common cathode, and light extraction structures). In some embodiments, each mesa structure may include a back reflector formed by a DBR on the first side of the epitaxial layers to improve the reflectivity and light extraction efficiency. For example, the back reflector may include a small metal plug in dielectric DBR layers to conduct current or may include transparent conductive DBR layers, and thus may have a much higher reflectivity than reflective metal reflectors. In some embodiments, other features (e.g., micro-lenses, other light extraction structures, or a partial reflector) may be formed on the second-side of the epitaxial layers during the processing from the second side of the epitaxial layers. For example, a front partial reflector (e.g., DBR) may be fabricated on the second-side of the epitaxial layers to form a resonant cavity with the back reflector, thereby forming RCLEDs.

In one example, a method of fabricating a micro-LED device may include obtaining a micro-LED wafer that includes a substrate, epitaxial layers grown on the substrate, and a back reflector layer formed on a first side (e.g., p side) of the epitaxial layers; etching through the back reflector layer and a portion of the epitaxial layers to form mesa structures of micro-LEDs, where each mesa structure of the mesa structures may include a conductive back reflector formed in the conductive back reflector layer; treating the sidewall surfaces of the etched mesa structures(e.g., using KOH or plasma); forming a passivation layer on sidewalls of the mesa structures; etching the remaining portion of the epitaxial layers to expose sidewall electrical contact regions for the micro-LEDs; depositing an oxide material in regions between the mesa structures; depositing a first contiguous metal bonding layer on the back reflector layer; bonding a second contiguous metal bonding layer on a backplane wafer to the first contiguous metal bonding layer; removing the substrate of the micro-LED wafer from a second side of the epitaxial layers; removing, from the second side (e.g., n side) of the epitaxial layers, the oxide material in the regions between the mesa structures; etching through the first and second contiguous metal bonding layers in regions under the oxide material to form individual metal electrodes (e.g., anodes) of the micro-LEDs; forming a dielectric material layer on exposed surfaces in the regions between the mesa structures; and depositing one or more metal materials in the regions between the mesa structures to form mesa sidewall reflectors and a common electrode (e.g., a common cathode) for the micro-LEDs.

In some embodiments, the back reflector layer may include (1) a distributed Bragg reflector that includes a plurality of transparent oxide layers and a plurality of metal plugs in the plurality of transparent oxide layers; (2) a transparent current spreading layer between the epitaxial layers and the distributed Bragg reflector; and (3) a conductive material layer on the distributed Bragg reflector and opposing the transparent current spreading layer, where the plurality of metal plugs electrically couple the transparent current spreading layer to the conductive material layer. In some embodiments, the back reflector layer may include a conductive distributed Bragg reflector that includes a plurality of semiconductor layers or a plurality of transparent conductive oxide layers. In some embodiments, the method may also include forming a partial reflector on the mesa structures, where the partial reflector and the conductive back reflector of each mesa structure of the mesa structures form a resonant cavity.

Compared with the hybrid bonding methods, the micro-LED device and the fabrication method disclosed herein may not need precise alignment between the micro-LED wafer and the backplane wafer, and may not need annealing for bonding pad dishing control. Therefore, yield and reliability may be improved. Compared with the post-bonding mesa formation methods, the bonding metal etching in the method disclosed herein may be performed after a passivation layer has been formed on the mesa sidewall, and thus may not cause active layers contamination that may reduce the internal quantum efficiencies and reliability. In addition, pre-bonding etching of epitaxial layers from the side (e.g., p side) that is close to the pixel drive circuits after the bonding may form mesa structures with more desirable shapes for light extraction efficiency improvement, and may facilitate sidewall surface treatment after the initial epitaxial layer etching. The use of DBR back reflectors rather than metal back reflectors may significantly increase the light extraction efficiency for small micro-LEDs, such as micro-LEDs with pitches less than about 3 µm or less than about 2 µm. RCLEDs that can emit light within a narrow spectral range and a small emission cone and with high intensity and high directionality may be fabricated using the method disclosed herein. As such, light emitted by the RCLEDs may be more efficiently collected by the display optics which may have limited receptance angle (e.g., within about ±18.50).

Distribute Bragg reflectors may be used in some light emitting devices, such as some LEDs (e.g., resonant cavity LEDs) and vertical-cavity surface-emitting lasers (VCSELs), to reflect light and/or form a resonant cavity. A DBR may include alternated layers of high-index and low-index materials, such as $TiO_2$, $Nb_2O_5$, and $SiO_2$, where each layer may have an optical thickness, for example, about a quarter of the target wavelength for normal incidence. For the target wavelength, the optical path length difference between the reflections at adjacent interfaces between the layers may be about a half of the target wavelength, and the reflection coefficients at the adjacent interfaces may have alternating signs due to the alternating refractive indices. Therefore, the reflected light from the interfaces may constructively interfere, thereby resulting in a high reflectance. The reflectivity of a DBR can be higher when the difference in refractive index between the high-index and the low-index layers (referred to herein as refractive index contrast or just index contrast) is higher and/or when the number of pairs of the high-index and the low-index layers is larger. DBRs made of dielectric materials, such as $TiO_2$, $Nb_2O_5$, and $SiO_2$, are generally not electrically conductive. Conductive DBRs may be formed using epitaxially grown semiconductor layers with alternating doping densities, which generally have low refractive index contrast. Some semiconductor materials may not be transparent to the emitted light due to high absorption.

In some embodiments, a conductive DBR may be made of transparent conductive material, and may be used as the electrical contact (e.g., the p-contact), the back reflector, and the current spreading layer. In some examples, the conductive DBR may include layers of a same transparent conductive oxide (TCO, e.g., ITO, Indium Zinc Oxide (IZO), or Aluminum Zinc Oxide (AZO)), where the layers may have alternating refractive indices caused by different porosities and/or nanorod orientations of the transparent conductive oxide. For example, the conductive DBR may include a set of crystalline ITO layers (e.g., having a first refractive index that may be tuned to an appropriate value, such as about 2.2 or another desired value, by changing the porosity of the ITO layers) interleaved with a set of porous ITO layers (e.g., having a second refractive index that may be tuned to an appropriate value, such as about 1.5 or another desired value, by changing the porosity of the ITO layers). In some embodiments, the conductive DBR may include layers of different transparent conductive oxides that have different refractive indices.

In some embodiments, a DBR made of dielectric layers can be used in conjunction with metal plugs that pass through the dielectric layers to form a conductive, reflective electrical contacts. The size of the metal plugs can be less than 0.5 µm in diameter, such as having a diameter about 0.2 µm. A transparent current spreading layer, such as an ITO layer, may be formed under the dielectric DBRs and connected to the metal plugs to improve the electrical connectivity.

Figure 14D:
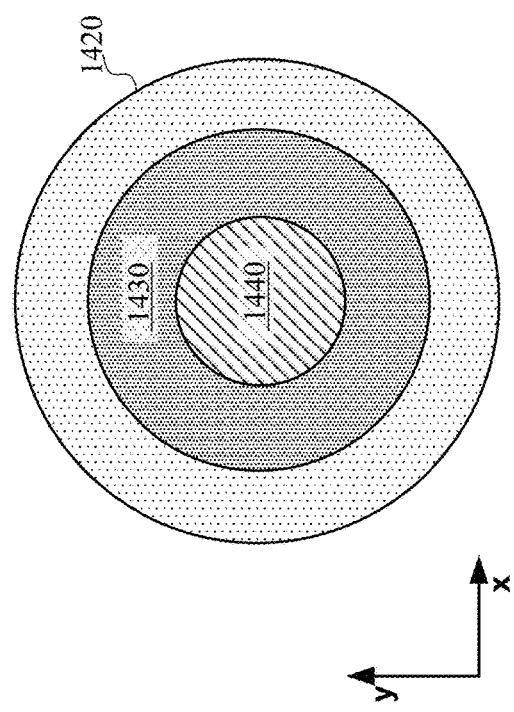

FIGS. 14C and 14D illustrate cross-sectional views of an example of a micro-LED 1402 including a DBR 1450 as the back reflector according to certain embodiments. Micro-LED 1402 may include epitaxial layers 1412 that are etched to form individual mesa structures. Epitaxial layers 1412 may include an n-type semiconductor layer, an active region, and a p-type semiconductor layer. Only a portion of the epitaxial layers (e.g., the p-type semiconductor layer) is shown in FIG. 14C. A transparent conductive material layer 1432 (e.g., an ITO layer) may be deposited on epitaxial layers 1410. Transparent conductive material layer 1432 may function as a current spreading layer.

DBR layers 1450 may be formed on transparent conductive material layer 1432. As described above, DBR layers 1450 may include alternated layers of high-index and low-index materials, where each layer may have an optical thickness about a quarter of the target wavelength for surface-normal incidence. The high-index and low-index materials may include, for example, $TiO_2$, $Nb_2O_5$, $SiO_2$, and TCO (e.g., ITO, IZO, and AZO). In the example shown in FIG. 14C, DBR layers 1450 may include non-conductive transparent oxide, such as $TiO_2$, $Nb_2O_5$, and $SiO_2$. DBR layers 1450 may be etched to form trenches in DBR layers 1450. An optional barrier/seed layer 1452 (e.g., a TiN or TaN layer) may be deposited on sidewalls of the trenches using, for example, reactive sputtering or atomic layer deposition techniques. A metal material (e.g., W, Al, or Cu) may be deposited in the trenches to form metal plugs 1442 using, for example, chemical vapor deposition (CVD) techniques. Transparent conductive material layer 1432 (e.g., an ITO layer) may help to spread the drive current from metal plug 1442 to epitaxial layers 1412. Barrier/seed layer 1452 may help to prevent electromigration or diffusion of metals caused by high-density currents and/or elevated operation temperatures, and may improve the adherence of the metal material to dielectric materials of DBR layers 1450. A dielectric layer 1422 (e.g., a SiN or $SiO_2$ layer) may be deposited on the top and sidewalls of the mesa structure that include epitaxial layers 1412 and DBR layers 1450 to provide passivation and electrical isolation. A conductive material layer 1460 (e.g., a TiN layer) and/or a metal layer (e.g., Ni or Ti) may be deposited on top of the mesa structure for bonding to pixel drive circuits on a backplane wafer.

As shown in FIGS. 14C and 14D, metal plug 1442 can have a small size compared to the size of the mesa structure. Thus, the reflectivity of DBR layers 1450 may be high. In one example, the diameter of the mesa structure may be about 1.4 µm, the diameter of metal plug 1442 may be about 0.2 µm, and the reflectivity of the back reflector formed by DBR layers 1450 may be about 96%. Thus, the structure shown in FIGS. 14C and 14D may be used in small micro-LEDs to improve the reflectivity of the back reflector and hence the light extraction efficiency.

Figure 15A:
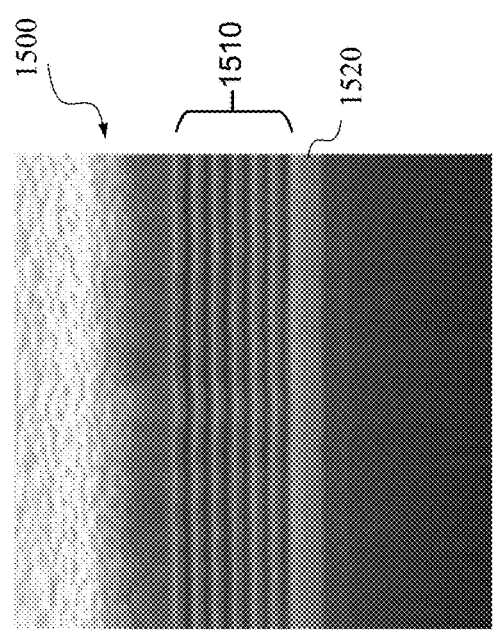
FIG. 15A illustrates an example of a back reflector including a DBR according to certain embodiments.

FIG. 15A illustrates an example of a back reflector 1500 including a DBR 1510 according to certain embodiments. In the illustrated example, DBR 1510 may be formed on an ITO layer 1520 and may reflect green light. DBR 1510 may include six pairs of a $SiO_2$ layer (e.g., about 80 nm thick) and a Nb$_2$O$_5$ layer (e.g., 50 nm thick). Thus, the total thickness of DBR 1510 may be less than about 800 nm.

Figure 15B:
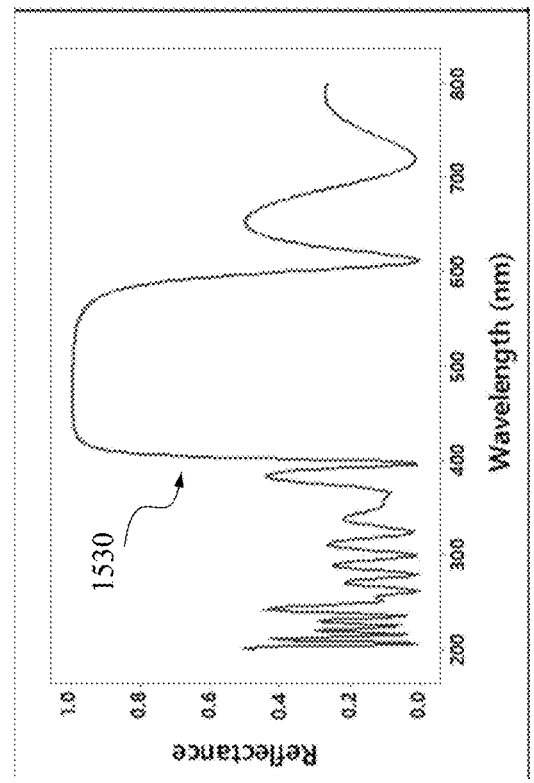
FIG. 15B illustrates the reflectance of the example of back reflector of FIG. 15A.

FIG. 15B illustrates the reflectance of the example of back reflector 1500 of FIG. 15A. A curve 1530 shows the reflectance of back reflector 1500 for surface-normal incident light of different wavelengths. The reflectivity can be close to 100% for green light and blue light. Higher reflectivity can be achieved by increasing the number of layers in DBR 1510.

Figure 15C:
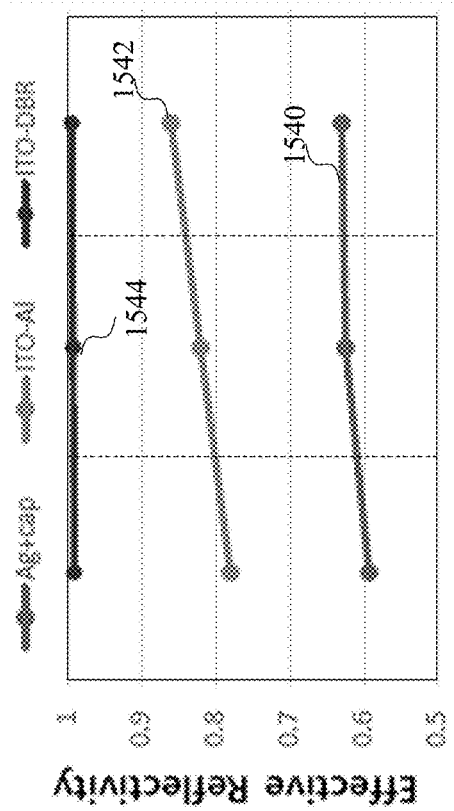
FIG. 15C illustrates the reflectance of different types of back reflectors at different wavelengths.

FIG. 15C illustrates the reflectance of different types of back reflectors used in small micro-LEDs for surface-normal incident light of different wavelengths. In the illustrated example, the small micro-LEDs may have a pitch about 2 µm and a mesa structure diameter about 1.4 µm. A curve 1540 in FIG. 15C shows the effective reflectivity of a back reflector including a metal (e.g., Ag) reflector and a barrier layer (e.g., a capping metal layer) as show in, for example, FIG. 14A. A curve 1542 shows the effective reflectivity of a back reflector including an ITO layer and an aluminum layer. A curve 1544 shows the effective reflectivity of a back reflector including an ITO layer and a DBR as show in, for example, FIG. 14C and FIG. 15A. FIG. 15C shows that the reflectivity of the back reflector shown in FIG. 14C may have a much higher and more consistent reflectivity for visible light of different colors.

Figures 16A, 16B:
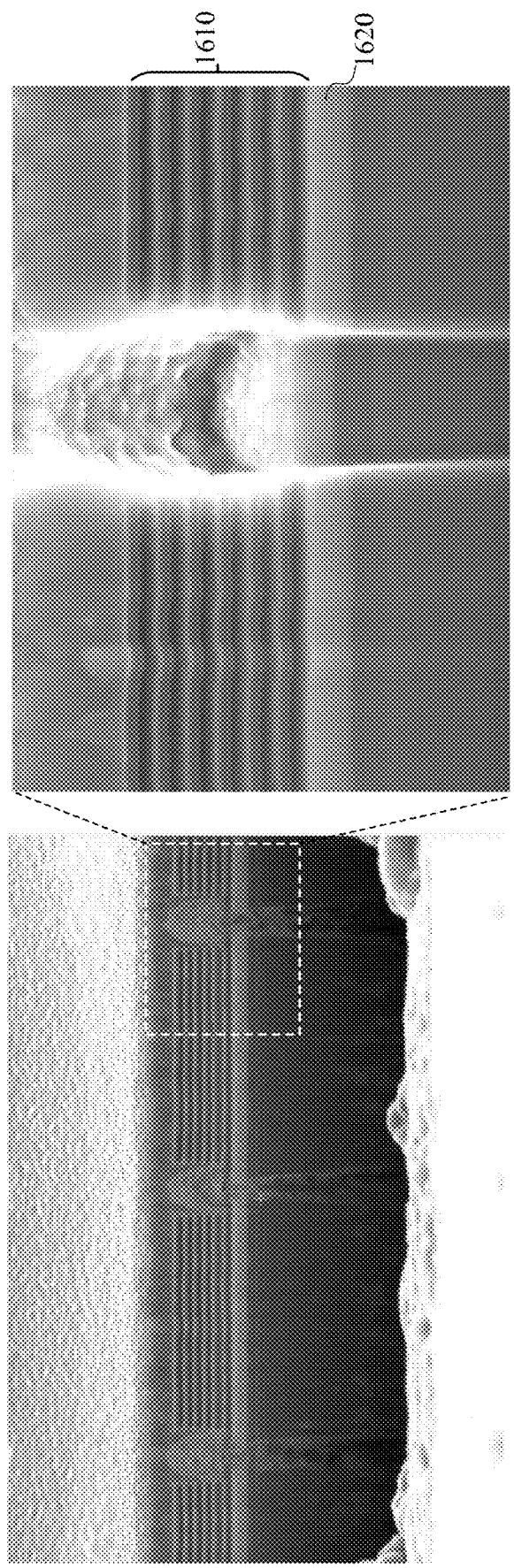
FIGS. 16A and 16B illustrate an example of etching DBR layers using a current spreading layer (e.g., an indium tin oxide (ITO) layer) as an etch stop layer according to certain embodiments.

FIGS. 16A and 16B illustrate an example of etching DBR layers 1610 using a current spreading layer 1620 (e.g., an ITO layer) as an etch stop layer according to certain embodiments. DBR layers 1610 may be similar to the DBR layers in DBR 1510 and may include six SiO$_2$ layer (e.g., each about 80 nm thick) interleaved with six Nb$_2$O$_5$ layer (e.g., each about 50 nm thick). As shown in FIG. 16B, the SiO$_2$ layers and the Nb$_2$O$_5$ layers may be etched at about the same etch rate, and the etching can have a high etch selectivity of SiO$_2$ and Nb$_2$O$_5$ over ITO (e.g., a very low etch rate for ITO), and thus may stop on the ITO layer.

Figure 17:
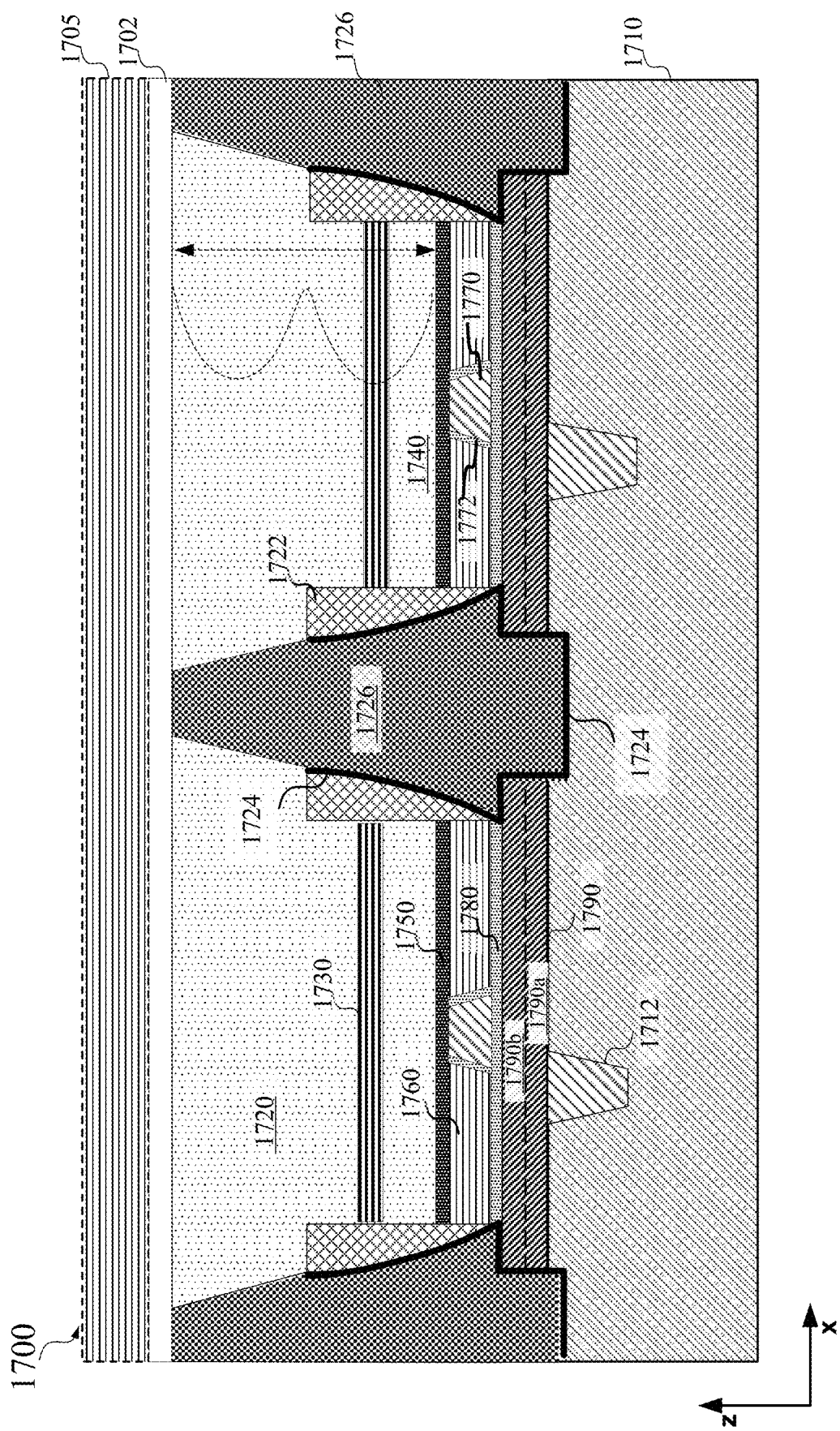
FIG. 17 illustrates an example of a micro-LED device fabricated using techniques disclosed herein according to certain embodiments.

FIG. 17 illustrates an example of a micro-LED device 1700 fabricated using techniques disclosed herein according to certain embodiments. Micro-LED device 1700 may be a die or a wafer including a two-dimensional array of micro-LEDs. FIG. 17 only shows two micro-LEDs in the 2D array. In the illustrated example, micro-LED device 1700 may include a CMOS backplane 1710 that includes pixel drive circuits (not shown) formed thereon. The pixel drive circuits may be connected to the 2D array of micro-LEDs through metal plugs 1712. Metal plugs 1712 may include, for example, tungsten or aluminum plugs formed in a dielectric layer (e.g., a SiO$_2$ or SiN) layer.

A metal bonding layer 1790a may be deposited on metal plugs 1712 in CMOS backplane 1710, and may be bonded to a metal bonding layer 1790b on a micro-LED wafer to form a bonded metal layer 1790. Metal bonding layers 1790a and 1790b may include, for example, Ni, Ti, TiN, or a combination thereof, and may be electrodes for the 2D array of micro-LEDs. Each micro-LED of the 2D array of micro-LEDs may include a back reflector as described above with respect to FIGS. 14C-16B. The back reflector may include, for example, one or more conductive material layers 1780 (e.g., including a TiN layer and an optional Al layer below the TiN layer), DBR layers 1760, a metal plug 1770 (e.g., W or Al) formed in DBR layers 1760, and a current spreading layer 1750 (e.g., a TCO layer such as an ITO layer). In some embodiments, metal plugs 1770 may include a barrier/seed layer 1772 (e.g., a TiN or TaN layer) as described above with respect to FIG. 14C. In some embodiments, the back reflector may be formed by transparent, conductive materials (e.g., ITO, IZO, AZO, or semiconductor materials), and thus metal plugs 1770 may or may not be used.

Each micro-LED may include epitaxial layers coupled to current spreading layer 1750. The epitaxial layers may include a first semiconductor layer 1740, an active region 1730, and a second semiconductor layer 1720. First semiconductor layer 1740 may include, for example, a p-doped GaN layer, an n-doped GaN layer, or another p-doped or n-doped III-V semiconductor layer. Active region 1730 may include one or more quantum wells formed by quantum well layers (e.g., InGaN layers) and barrier layers (e.g., GaN layers) as described above. Second semiconductor layer 1720 may include a semiconductor material that is oppositely doped compared to first semiconductor layer 1740, and may include, for example, an n-doped GaN layer, a p-doped GaN layer, or another p-doped or n-doped III-V semiconductor layer.

The sidewalls of the back reflector and the epitaxial layers may include a passivation layer 1722 and a dielectric isolation layer 1724 to electrically isolate the micro-LEDs in the 2D array. Dielectric isolation layer 1724 may also be formed at sidewalls of bonded metal layer 1790 (e.g., which may function as electrodes, such as anodes) and the bottom of the regions between adjacent micro-LEDs as shown in FIG. 17. Metal materials 1726 (e.g., including a reflective metal such as Al, a barrier metal such as TiN or TaN, and a filling metal such as Au, Cu, Al, or W) may form on the sidewall and fill the regions between adjacent micro-LEDs. Metal materials 1726 may form sidewall reflectors for the micro-LEDs and may optically isolate the micro-LEDs. Therefore, light emitted in active region 1730 may be reflected by the back reflector and the sidewall reflector towards second semiconductor layer 1720 and be extracted out of the micro-LED. A transparent conductive layer 1702 (e.g., an ITO layer) may be deposited on second semiconductor layer 1720 and contact metal materials 1726. Metal materials 1726 and transparent conductive layer 1702 may function as an electrical contact (e.g., a common electrode, such as a common cathode) for second semiconductor layer 1720.

In some embodiments, light extraction structures, such as micro-lenses, may be formed on transparent conductive layer 1702. In some embodiments, a partial reflector that includes a DBR 1705 may be formed on transparent conductive layer 1702. DBR 1705 may include transparent oxide materials with alternated refractive indices as described above. DBR 1705 may have a reflectivity less than 100% such that some light may pass through DBR 1795 but a majority of the emitted light may be reflected back. DBR 1705 and the back reflector (e.g., DBR layers 1760) may form a resonant cavity for light emitted in active region 1730. Therefore, the micro-LEDs may be RCLEDs, which may emit light within a narrow spectral range and a small emission cone and with high intensity and high directionality. As such, light emitted by the RCLEDs may be more efficiently collected and coupled to a display system (e.g., a waveguide-based display) by display optics that may have limited acceptance angles.

In some embodiments, first semiconductor layer 1740 may be p-doped and second semiconductor layer 1720 may be n-doped. Thus, second semiconductor layer 1720, transparent conductive layer 1702, and metal materials 1726 may form a common cathode, where each micro-LED may be addressed through a respective anode (e.g., formed in bonded metal layer 1790). In some embodiments, first semiconductor layer 1740 may be n-doped and second semiconductor layer 1720 may be p-doped. Thus, second semiconductor layer 1720, transparent conductive layer 1702, and metal materials 1726 may form a common anode, where each micro-LED may be addressed through a respective cathode (e.g., formed in bonded metal layer 1790).

Figure 18E:
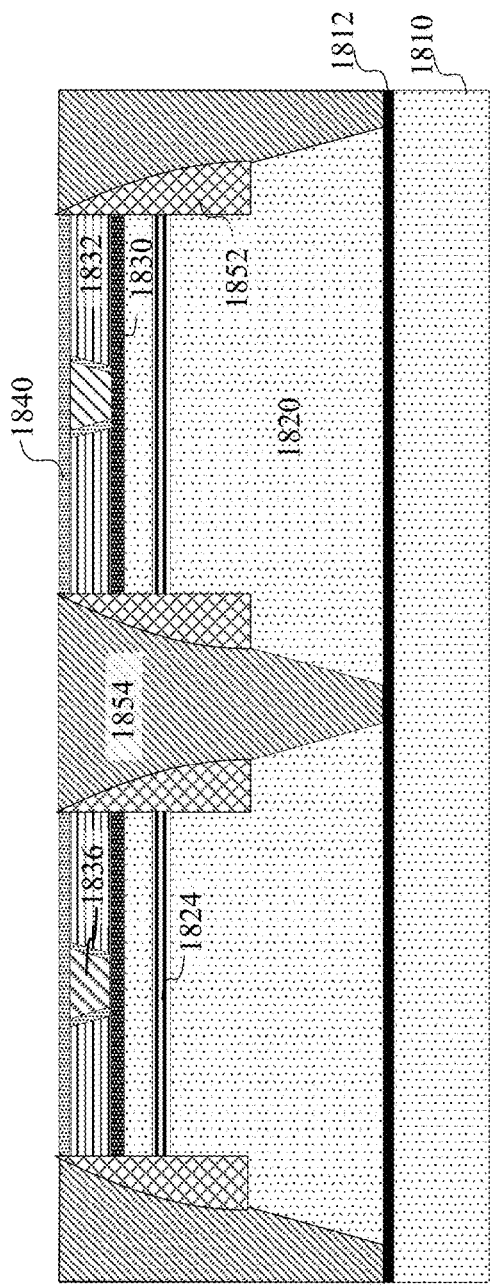

FIGS. 18A-18L illustrate an example of a process for fabricating a micro-LED device (e.g., micro-LED device 1700 of FIG. 17) according to certain embodiments. FIG. 18A illustrates an example of a micro-LED wafer 1800. Micro-LED wafer 1800 may include a substrate (e.g., a sapphire substrate, not shown) and a buffer layer 1810 (e.g., a GaN layer, which may be doped or undoped) formed on the substrate. An etch stop layer 1812 (e.g., an AlGaN layer) may be epitaxially grown on buffer layer 1810. Epitaxial layers 1820 may be grown on etch stop layer 1812. In the illustrated example, an n-type semiconductor layer 1822 of epitaxial layers 1820 may be grown first on etch stop layer 1812. In some other embodiments, for example, in a device using phosphide-based (e.g., III-P) semiconductor materials, a p-type semiconductor layer may be grown first. Active layers 1824 may be grown on n-type semiconductor layer 1822. Active layers 1824 may include one or more quantum well layers and two or more quantum barrier layers to form one or more quantum wells. A p-type semiconductor layer 1826 may be grown on active layers 1824. In one example, epitaxial layers 1820 including n-type semiconductor layer 1822, active layers 1824, and p-type semiconductor layer 1826 may have a total thickness about 1 μm.

A current spreading layer 1830 may be deposited on p-type semiconductor layer 1826. As described above, current spreading layer 1830 may include a transparent conductive oxide, such as ITO, IZO, or AZO. DBR layers 1832 may be formed on current spreading layer 1830. DBR layers 1832 may include transparent oxides such as a combination of $TiO_2$, $Nb_2O_5$, $SiO_2$, and TCO as described above. In some embodiments, DBR layers 1832 may have a total thickness less than about 1 μm. Metal plugs 1836 may be formed in DBR layers 1832 by etching DBR layers 1832 using current spreading layer 1830 as the etch strop layer to form trenches in DBR layers 1832, and depositing a metal material (e.g., W or Al) in the trenches using, for example, CVD, as described above with respect to, for example, FIGS. 14C-17. Metal plugs 1836 may include a barrier/seed layer 1834 (e.g., a TiN or TaN layer) on the sidewalls. In some embodiments, each metal plug 1836 may have a diameter about 0.2 μm. A planarization process (e.g., CMP) or an etching process may be performed to remove the metal material (e.g., W or Al) deposited on DBR layers 1832. A conductive material layer 1840 (e.g., including a TiN or TaN layer and an optional Al layer) may then be deposited on DBR layers 1832.

FIG. 18B shows that micro-LED wafer 1800 may be etched from the side of conductive material layer 1840 to form individual mesa structures 1850. The etching may be performed using a patterned etch mask 1842 on conductive material layer 1840. Patterned etch mask 1842 may be formed by depositing an etch mask layer (e.g., $SiO_2$) and patterning the etch mask layer using a photolithography process. The etching may etch through conductive material layer 1840, DBR layers 1832, current spreading layer 1830, p-type semiconductor layer 1826, active layers 1824, and a portion of n-type semiconductor layer 1822. The etching may include multiple etching processes to etch different material layers using different etching techniques and/or different recipes. After the etching, the sidewall surfaces of mesa structures 1850 formed by the etching may be treated, for example, using KOH solution or plasma, to clean the sidewall surfaces and remove sidewall damages caused by the etching. In one embodiment, each mesa structure 1850 may have a linear dimension (e.g., in x direction) about 1.4 μm, the gap between adjacent mesa structures 1850 may have a linear dimension (e.g., in x direction) about 0.6 μm, and thus mesa structures 1850 may have a pitch about 2 μm.

FIG. 18C shows that a passivation/spacer layer 1852 may be formed on sidewalls of mesa structures 1850. Passivation/spacer layer 1852 may include a dielectric material, such as SiN. Passivation/spacer layer 1852 may be formed by depositing the dielectric material on surfaces of mesa structures 1850, and selectively etching the dielectric material at the top of mesa structures 1850 and at the bottoms of the regions between mesa structures 1850. Passivation/spacer layer 1852 may be used to protect the sidewalls of the mesa structures during subsequent processes.

FIG. 18D shows that micro-LED wafer 1800 may be further etched to etch into epitaxial layers 1820, more specifically, n-type semiconductor layer 1822. The etching may use patterned etch mask 1842 and passivation/spacer layer 1852 as the etch mask. Etch stop layer 1812 may be used as the etch stop layer such that n-type semiconductor layer 1822 may be etched through without etching into buffer layer 1810. In this etching operation, sidewalls of active layers 1824 may be protected by passivation/spacer layer 1852 and thus would not be damaged by the etching.

In FIG. 18E, an oxide material 1854, such as $SiO_2$, may be deposited on the micro-LED wafer to fill the gaps between mesa structures 1850. A planarization (e.g., CMP) process may then be performed to remove the oxide material on top of conductive material layer 1840, including patterned etch mask 1842. Conductive material layer 1840 (e.g., including a TiN or TaN layer and an optional Al layer) may be used as the stop layer for the planarization process.

Figure 18F:
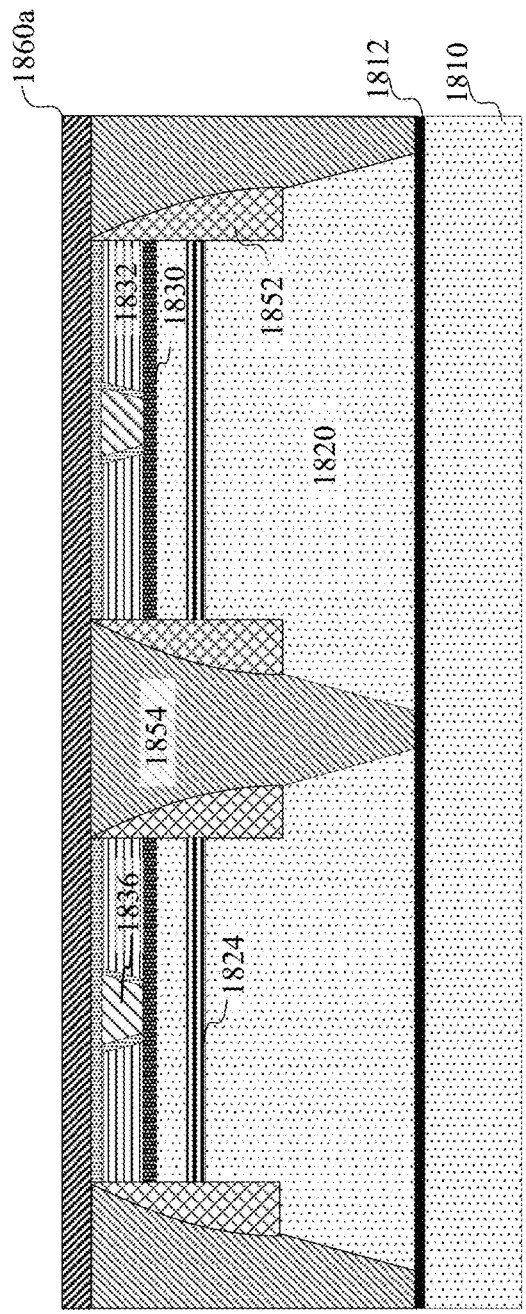

In FIG. 18F, a metal bonding layer 1860a may be deposited on mesa structures 1850 and oxide material 1854. Metal bonding layer 1860a may include one or more sublayers that may include, for example, Ni, TiN, Ti, Au, Cu, Al, or a combination thereof. In one example, metal bonding layer 1860a may include a Ni sublayer, a TiN sublayer, and a Ti sublayer.

FIG. 18G shows that micro-LED wafer 1800 may be bonded to a CMOS backplane 1870 to form a wafer stack. As described above with respect to FIG. 17, CMOS backplane 1870 may include pixel drive circuits (not shown) formed thereon. The pixel drive circuits may be electrically connected to micro-LED wafer 1800 through metal contacts 1872. Metal contacts 1872 may include, for example, tungsten or aluminum plugs formed in a dielectric layer (e.g., a $SiO_2$ or SiN) layer. A metal bonding layer 1860b may be deposited on metal contacts 1872 of CMOS backplane 1870, and may be bonded to metal bonding layer 1860a on micro-LED wafer 1800 to form a bonded metal layer 1860. As shown in FIG. 18G, micro-LED wafer 1800 and CMOS backplane 1870 may not need to be precisely aligned. For example, as long as a metal contact 1872 falls within the region of the back reflector (e.g., with a diameter about 1.2-1.4 μm) in each mesa structure or an even larger region (e.g., equal to or greater than the lateral size of a mesa structure 1850) in x and y directions, metal contact 1872 can be in electrical contact with the corresponding micro-LED after the etching of bonded metal layer 1860 to form individual electrodes and electrically isolate the micro-LEDs as shown below. In some embodiments, each metal contact 1872 may have a linear dimension less than about 30% or less than about 20% of a pitch of mesa structures 1850.

In FIG. 18H, the substrate and the buffer layer 1810 of micro-LED wafer 1800 may be thinned down to etch stop layer 1812 through, for example, back grinding, etching, laser lifting, or a combination thereof. The wafer stack may be supported by silicon substrate of CMOS backplane 1870. In some embodiments, etch stop layer 1812 may be at least partially removed.

Figure 18I:
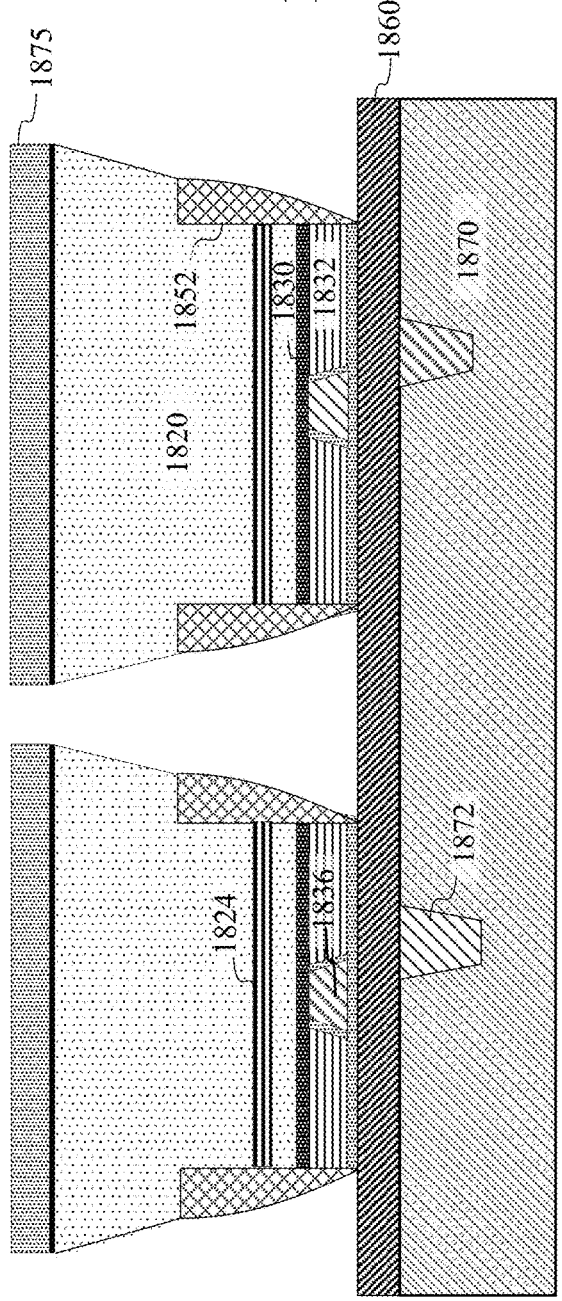

In FIG. 18I, an etch mask 1875 may be formed on etch stop layer 1812 or epitaxial layers 1820. Etch mask 1875 may align with epitaxial layers 1820 of mesa structures 1850. Etch mask 1875 may be formed by depositing an etch mask layer (e.g., a SiN layer) and patterning the etch mask layer using a photolithography process. Etch mask 1875 may then be used to etch oxide material 1854 (e.g., $SiO_2$) in regions between mesa structures 1850. The etching may include wet and/or dry etching processes that may have high selectivity of $SiO_2$ over other materials, such as SiN and semiconductor materials (e.g., GaN), such that oxide material 1854 may be removed without etching other materials.

Figure 18J:
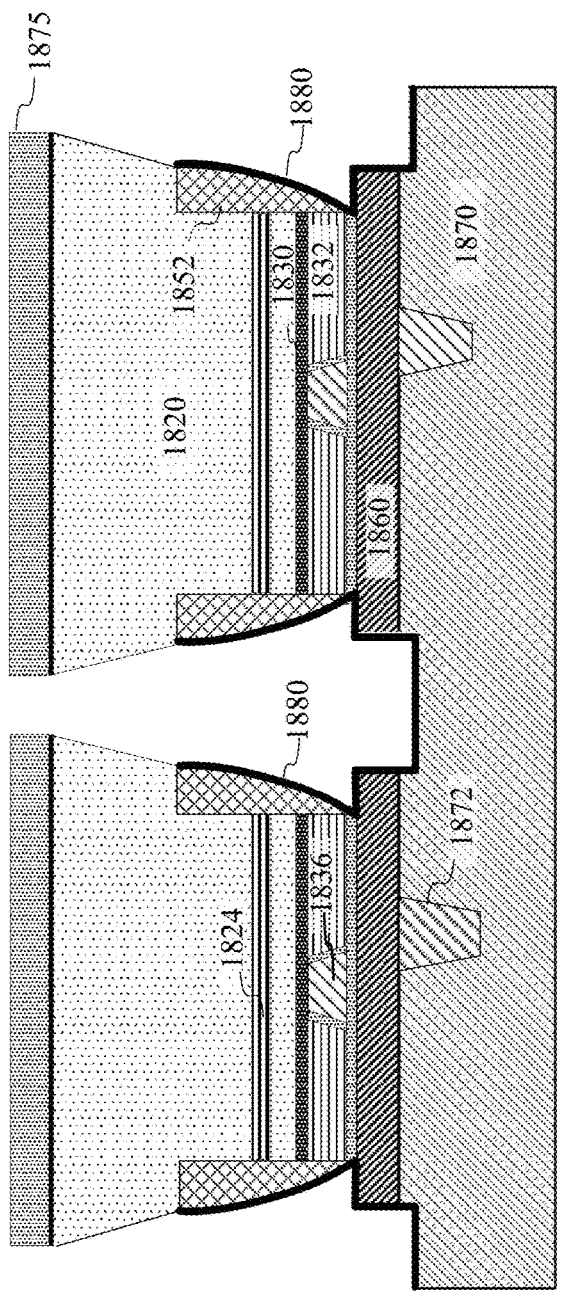

In FIG. 18J, bonded metal layer 1860 may be etched through using etch mask 1875 in a wet or dry etching process to separate the anodes of individual micro-LEDs. Because the sidewalls of active region 1824 are protected by the passivation layer, etching bonded metal layer 1860 may not deposit metal materials on the sidewalls of active region 1824 to contaminate active region 1824. The etching may continue after etching through bonded metal layer 1860 and may etch into the dielectric layer on CMOS backplane 1870. After the etching, a dielectric layer 1880 may be deposited through etch mask 1875 onto surfaces in regions between adjacent mesa structures to electrically isolate anodes of adjacent micro-LEDs.

In FIG. 18K, metal material 1882 (e.g., including a reflective metal such as Al, a barrier metal such as TiN or TaN, and a filling metal such as Au, Cu, Al, or W) may be deposited on the surface of mesa and gaps between the mesa structures to fill the gaps. Metal materials 1882 may form sidewall reflectors for the micro-LEDs and may optically isolate the micro-LEDS. Metal materials 1882 may also function as n-contacts on sidewalls of n-type semiconductor layer 1822. Metal materials 1882 may be a common cathode for the micro-LEDs. Light emitted in active layers 1824 may be reflected by the back reflector and the sidewall reflector towards n-type semiconductor layer 1822 and be extracted out of the micro-LED.

In FIG. 18L, etch mask 1875 may be removed and a transparent conductive layer 1885 (e.g., an ITO layer) may be deposited on n-type semiconductor layer 1822. Transparent conductive layer 1885 and metal materials 1882 may form a common cathode for the micro-LEDs. Optionally, DBR layers of a DBR 1890 may be deposited on transparent conductive layer 1885. DBR 1890 may include transparent materials of different refractive indices as described above. DBR 1890 may have a reflectivity less than 100% such that some light emitted in active layers 1824 may pass through but a majority of the light emitted in active layers 1824 may be reflected back. Therefore, DBR 1890 and the back reflector (e.g., DBR layers 1832) may form a resonant cavity for light emitted in active layers 1824. As such, the fabricated micro-LEDs may be resonant-cavity LEDs, which may emit light within a narrow spectral range and a small emission cone and with high intensity and high directionality. As a result, light emitted by the RCLEDs may be more efficiently collected and coupled by the display optics of a display system that may have limited acceptance angles.

Figure 19:
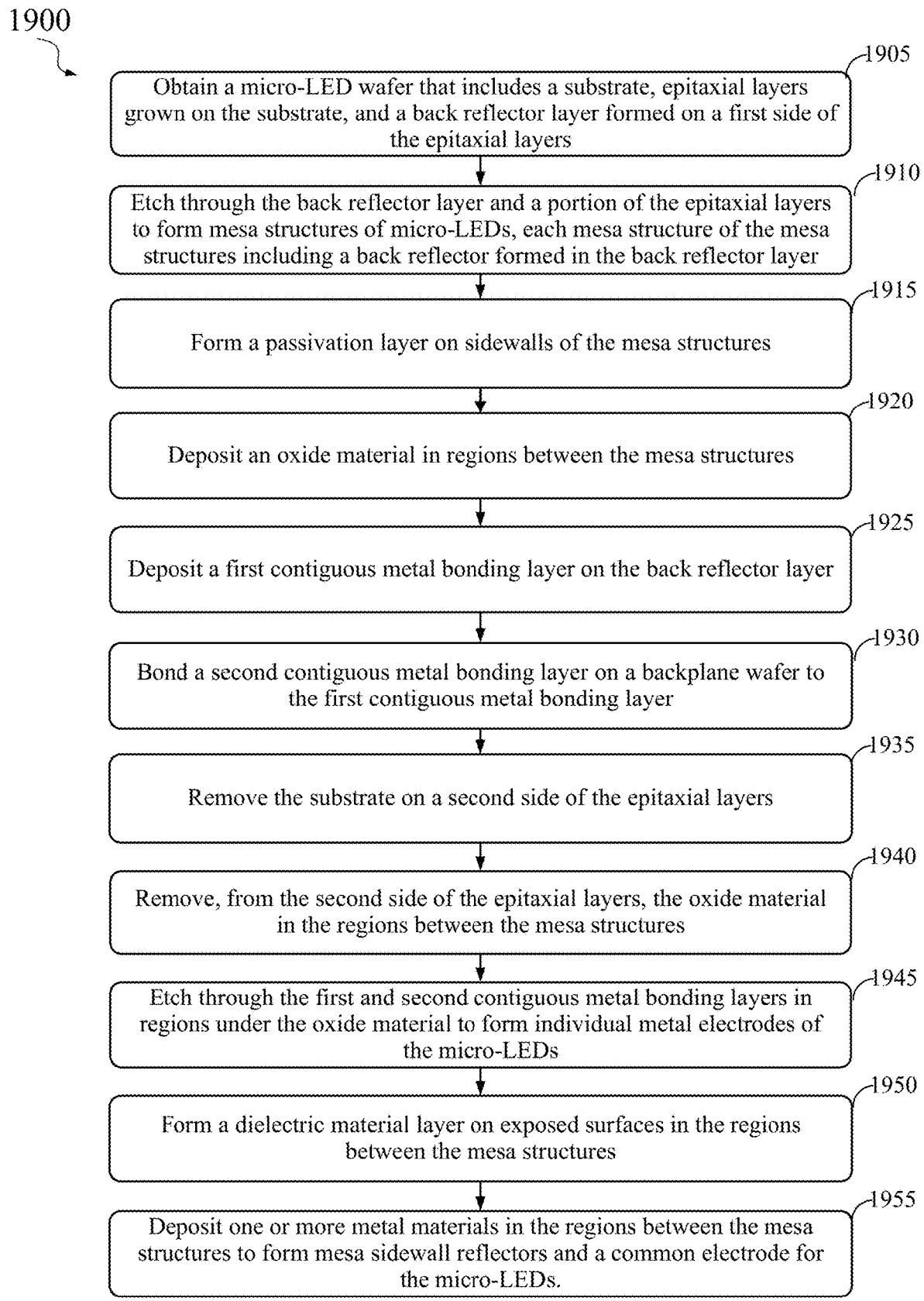
FIG. 19 includes a flowchart illustrating an example of a method of fabricating a micro-LED device according to certain embodiments.

FIG. 19 includes a flowchart 1900 illustrating an example of a method of fabricating a micro-LED device according to certain embodiments. It is noted that the operations illustrated in FIG. 19 provide particular processes for fabricating micro-LED devices. Other sequences of operations can also be performed according to alternative embodiments. For example, alternative embodiments may perform the operation in a different order. Moreover, the individual operations illustrated in FIG. 19 can include multiple sub-operations that can be performed in various sequences as appropriate for the individual operation. Furthermore, some operations can be added or removed depending on the particular applications. In some implementations, two or more operations may be performed in parallel. One of ordinary skill in the art would recognize many variations, modifications, and alternatives.

Operations in block 1905 of flowchart 1900 may include obtaining a micro-LED wafer that include a substrate, epitaxial layers grown on the substrate, and a back reflector layer formed on a first side (the side further away from the substrate) of the epitaxial layers. The epitaxial layers may include an n-type semiconductor layer (e.g., a GaN layer doped with Si or Ge), a p-type semiconductor layer (e.g., a GaN layer doped with Mg, Ca, Zn, or Be), and an active region between the n-type semiconductor layer and the p-type semiconductor layer and configured to emit light (e.g., visible light). The active region may include multiple quantum wells or an MQW formed by quantum well layers (e.g., InGaN layer) sandwiched by barrier layers (e.g., GaN layer) as described above. The substrate may include, for example, a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane (e.g., c-plane or a semipolar plane) as the growth surface. In some embodiments, a buffer layer may be formed on the substrate to improve the lattice matching of the epitaxial layers, thereby reducing stress and defects in the epitaxial layers. The epitaxial layers may be grown layer-by-layer on the substrate or the buffer layer using techniques such as VPE, LPE, MBE, or MOCVD. In some embodiments, such as devices made of III-N materials, the n-type semiconductor layer may be grown first during the growth of the epitaxial layers, and the p-type semiconductor layer may be grown after the growth of the active region, for example, to avoid contamination of the active region with Mg dopants and facilitate activation of the dopants in the p-type semiconductor layer. In some embodiments, such as devices made of III-P materials, either the n-type semiconductor layer or the p-type semiconductor layer may be grown first during the growth of the epitaxial layers. In some embodiments, the micro-LED wafer may include an etch stop layer between the substrate (or the buffer layer) and the epitaxial layers.

In some embodiments, the back reflector layer may include a distributed Bragg reflector that includes a plurality of transparent oxide layers and a plurality of metal plugs (e.g., W or Al plugs) in the plurality of transparent oxide layers. The back reflector layer may also include a transparent current spreading layer (e.g., an ITO layer) between the epitaxial layers and the DBR, and a conductive material layer (e.g., a TiN or TaN layer) on the DBR and opposing the transparent current spreading layer. The plurality of metal plugs may electrically couple the transparent current spreading layer to the conductive material layer. In some embodiments, a pitch of the plurality of metal plugs is equal to a pitch of the mesa structures, and a linear dimension of each metal plug of the plurality of metal plugs is less than 20% (e.g., about 10%) of the pitch of the mesa structures. In some embodiments, obtaining the micro-LED wafer may include etching, using the transparent current spreading layer as an etch stop layer, the plurality of transparent oxide layers to form a plurality of trenches in the plurality of transparent oxide layers, and forming the plurality of metal plugs in the plurality of trenches, for example, by depositing a metal (e.g., W or Al) material to fill the trenches. In some embodiments, a barrier/seed layer may be deposited on sidewalls of the trenches before depositing the metal material. In some embodiments, the back reflector layer may include a distributed Bragg reflector that includes a plurality of semiconductor layers or a plurality of transparent conductive oxide (e.g., ITO, IZO, or AZO) layers. In some embodiments, the plurality of semiconductor layers or the plurality of transparent conductive oxide layers may have different porosities and thus may have different refractive indices. In some embodiments, the back reflector layer may include a reflective metal (e.g., Ag, Al, or Au) layer.

Operations in block 1910 may include etching through the back reflector layer and a portion of the epitaxial layers to form mesa structures of micro-LEDs, where each mesa structure of the mesa structures may include a back reflector formed in the back reflector layer. In embodiments where the micro-LED wafer includes a transparent current spreading layer and a conductive material layer, the transparent current spreading layer and the conductive material layer may also be etched. Each mesa structure may have vertical or slanted sidewalls. For example, in each mesa structure, an epitaxial layer close to the back reflector layer may have an area smaller than an area of an epitaxial layer further away from the back reflector layer, due to the etching from the side of the back reflector layer. In some embodiments, the back reflector in each mesa structure may have an area equal to an area of the epitaxial layer adjacent to the back reflector.

Operations in block 1915 may include forming a passivation layer (e.g., a SiN layer) on sidewalls of the mesa structures. The passivation layer may be deposited on sidewalls of the mesa structures. The passivation layer may protect the sidewalls of the active region and electrically isolate the mesa structures. In some embodiments, wet treatment (e.g., using KOH) and/or plasma treatment may be performed after the etching and before forming the passivation layer, in order to remove oxide related compounds and/or surface defects at etched sidewalls of the active layers to improve quantum efficiencies of the micro-LEDs. In some embodiments, the remaining portion of the epitaxial layers may be further etched, for example, down to the etch stop layer of the micro-LED wafer to expose sidewall electrical contact regions for the micro-LEDs. The portion of the epitaxial layers protected by the passivation layer may not be etched.

Operations in block 1920 may include depositing an oxide material (e.g., $SiO_2$) in regions between the mesa structures to fill the regions between the mesa structures. In some embodiments, a planarization (e.g., CMP) process may be performed to remove the oxide material on the back reflectors of the mesa structures and planarize the top surface of the micro-LED wafer for subsequent processes.

Operations in block 1925 may include depositing a first contiguous metal bonding layer on the top surface of the micro-LED wafer. The first contiguous metal bonding layer may include one or more sublayers that may include, for example, Ni, TiN, Ti, Au, Cu, Al, or a combination thereof. In one example, the first contiguous metal bonding layer may include a Ni sublayer, a TiN sublayer, and a Ti sublayer.

Operations in block 1930 may include bonding a second contiguous metal bonding layer of a backplane wafer to the first contiguous metal bonding layer of the micro-LED wafer. The backplane wafer may include pixel drive circuits and an interconnect layer formed thereon. The pixel drive circuits may include digital and analog pixel drive circuits for driving individual micro-LEDs. The pixel drive circuit of each pixel may have an area similar to the pixel size (e.g., $2\times 2$ $\mu m^2$) of the micro-LEDs. The interconnect layer may include a plurality of metal contacts (e.g., W, Cu, or Al contact pads) formed in a dielectric layer (e.g., a $SiO_2$ or SiN layer), and may couple to the second contiguous metal bonding layer. Each metal contact of the plurality of metal contacts may fully fall on or align with a region of a respective mesa structure. In some embodiments, each metal contact of the plurality of metal contacts on the backplane wafer may be characterized by a linear dimension less than about 30% or less than about 20% of a pitch of the mesa structures. Therefore, the micro-LED wafer and the backplane wafer may not need to be precisely aligned during the bonding. As long as a metal contact of the backplane wafer is within the region of the back reflector in each mesa structure or an even larger region in each pixel (e.g., equal to or greater than an lateral area of a mesa structure of the micro-LED for the pixel) as shown in FIGS. 17 and 18G-18L, the metal contact can be in electrical contact with the corresponding micro-LED after the etching of the first and second contiguous metal bonding layers to form individual electrodes for the micro-LEDs and electrically isolate the micro-LEDs.

Operations in block 1935 may include removing the substrate from a second side (e.g., n-side) of the epitaxial layers. For example, the substrate (and a buffer layer if present) of the micro-LED wafer may be thinned down to the etch stop layer through, for example, back grinding, etching, laser lifting, or a combination thereof. The mesa structures may now be supported by the silicon substrate of the backplane wafer. In some embodiments, the etch stop layer may be partially removed or completely removed.

Operations in block 1940 may include removing, from the second side of the epitaxial layers, the oxide material in the regions between the mesa structures. For example, an etch mask that aligns with the epitaxial layers of the mesa structures may be formed on the second side of the epitaxial layers. Wet and/or dry etching processes that have high selectivity of $SiO_2$ over other materials (e.g., SiN and semiconductor materials such as GaN) may be performed using the etch mask, such that the oxide material in the regions between the mesa structures may be removed without etching other materials.

Operations in block 1945 may include etching through the first and second contiguous metal bonding layers in regions under the oxide material to separate individual metal electrodes of the micro-LEDs. Because the sidewalls of the active region is protected by the passivation layer, etching the contiguous metal bonding layers may not deposit metal materials on the sidewalls of the active region to contaminate the active region. The etching may continue after etching through the metal bonding layers and may etch into the dielectric layer on the backplane wafer to separate the individual metal electrodes of the micro-LEDs.

Operations in block 1950 may include forming a dielectric material layer on exposed surfaces in the regions between the mesa structures to electrically isolate electrodes (e.g., anodes) of adjacent micro-LEDs. Operations in block 1955 may include depositing one or more metal materials (e.g., including a reflective metal such as Al, a barrier metal such as TiN or TaN, and a filling metal such as Au, Cu, Al, or W) in the regions between the mesa structures to form mesa sidewall reflectors. The one or more metal materials deposited in the regions between the mesa structures may be in contact with the sidewall electrical contact regions for the micro-LEDs to form a common electrode (e.g., a common cathode) for the micro-LEDs. In some embodiments, a transparent conductive layer (e.g., an ITO layer) may be deposited on the second side of the epitaxial layers as shown in FIG. 17 and FIG. 18L to form (in combination with the one or more metal materials) a common electrode for the micro-LEDs.

In some embodiments, a partial reflector including DBR layers may be deposited on the transparent conductive layer at the second side of the epitaxial layers. The DBR layers may include transparent dielectric materials of different refractive indices as described above. The partial reflector may have a reflectivity less than 100% such that some light emitted in the active region may pass through the partial reflector but a majority of the light emitted in the active region may be reflected back. The partial reflector and the back reflector of each micro-LED (e.g., DBR layers 1832) may form a resonant cavity for the visible light emitted in the active region. Therefore, the micro-LEDs may be RCLEDs, which may emit light within a narrow spectral range and a small emission cone and with high intensity and high directionality. As such, light emitted by the RCLEDs may be more efficiently collected and coupled by the display optics of a waveguide display system that may have limited acceptance angles (e.g., ±18.5°).

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 20:
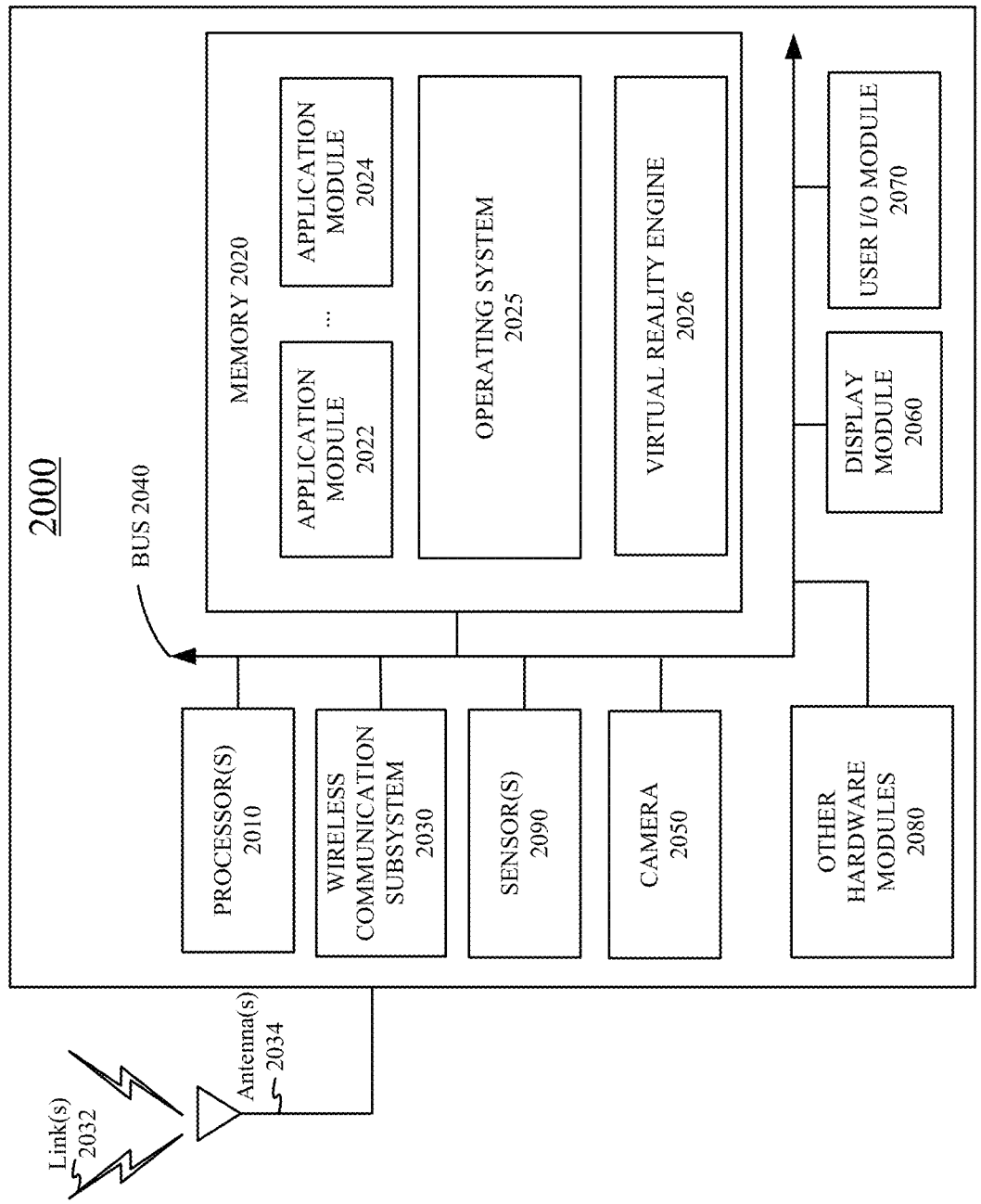
FIG. 20 is a simplified block diagram of an electronic system of an example of a near-eye display according to certain embodiments.

FIG. 20 is a simplified block diagram of an example electronic system 2000 of an example near-eye display (e.g., HMD device) for implementing some of the examples disclosed herein. Electronic system 2000 may be used as the electronic system of an HMD device or other near-eye displays described above. In this example, electronic system 2000 may include one or more processor(s) 2010 and a memory 2020. Processor(s) 2010 may be configured to execute instructions for performing operations at a number of components, and can be, for example, a general-purpose processor or microprocessor suitable for implementation within a portable electronic device. Processor(s) 2010 may be communicatively coupled with a plurality of components within electronic system 2000. To realize this communicative coupling, processor(s) 2010 may communicate with the other illustrated components across a bus 2040. Bus 2040 may be any subsystem adapted to transfer data within electronic system 2000. Bus 2040 may include a plurality of computer buses and additional circuitry to transfer data.

Memory 2020 may be coupled to processor(s) 2010. In some embodiments, memory 2020 may offer both short-term and long-term storage and may be divided into several units. Memory 2020 may be volatile, such as static random access memory (SRAM) and/or dynamic random access memory (DRAM) and/or non-volatile, such as read-only memory (ROM), flash memory, and the like. Furthermore, memory 2020 may include removable storage devices, such as secure digital (SD) cards. Memory 2020 may provide storage of computer-readable instructions, data structures, program modules, and other data for electronic system 2000. In some embodiments, memory 2020 may be distributed into different hardware modules. A set of instructions and/or code might be stored on memory 2020. The instructions might take the form of executable code that may be executable by electronic system 2000, and/or might take the form of source and/or installable code, which, upon compilation and/or installation on electronic system 2000 (e.g., using any of a variety of generally available compilers, installation programs, compression/decompression utilities, etc.), may take the form of executable code.

In some embodiments, memory 2020 may store a plurality of application modules 2022 through 2024, which may include any number of applications. Examples of applications may include gaming applications, conferencing applications, video playback applications, or other suitable applications. The applications may include a depth sensing function or eye tracking function. Application modules 2022-2024 may include particular instructions to be executed by processor(s) 2010. In some embodiments, certain applications or parts of application modules 2022-2024 may be executable by other hardware modules 2080. In certain embodiments, memory 2020 may additionally include secure memory, which may include additional security controls to prevent copying or other unauthorized access to secure information.

In some embodiments, memory 2020 may include an operating system 2025 loaded therein. Operating system 2025 may be operable to initiate the execution of the instructions provided by application modules 2022-2024 and/or manage other hardware modules 2080 as well as interfaces with a wireless communication subsystem 2030 which may include one or more wireless transceivers. Operating system 2025 may be adapted to perform other operations across the components of electronic system 2000 including threading, resource management, data storage control and other similar functionality.

Wireless communication subsystem 2030 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2000 may include one or more antennas 2034 for wireless communication as part of wireless communication subsystem 2030 or as a separate component coupled to any portion of the system. Depending on desired functionality, wireless communication subsystem 2030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2030 may permit data to be exchanged with a network, other computer systems, and/or any other devices described herein. Wireless communication subsystem 2030 may include a means for transmitting or receiving data, such as identifiers of HMD devices, position data, a geographic map, a heat map, photos, or videos, using antenna(s) 2034 and wireless link(s) 2032. Wireless communication subsystem 2030, processor(s) 2010, and memory 2020 may together comprise at least a part of one or more of a means for performing some functions disclosed herein.

Embodiments of electronic system 2000 may also include one or more sensors 2090. Sensor(s) 2090 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2090 may include one or more IMUs and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IU, internal to the IMU, or any combination thereof. At least some sensors may use a structured light pattern for sensing.

Electronic system 2000 may include a display module 2060. Display module 2060 may be a near-eye display, and may graphically present information, such as images, videos, and various instructions, from electronic system 2000 to a user. Such information may be derived from one or more application modules 2022-2024, virtual reality engine 2026, one or more other hardware modules 2080, a combination thereof, or any other suitable means for resolving graphical content for the user (e.g., by operating system 2025). Display module 2060 may use LCD technology, LED technology (including, for example, OLED, ILED, µ-LED, AMOLED, TOLED, etc.), light emitting polymer display (LPD) technology, or some other display technology.

Electronic system 2000 may include a user input/output module 2070. User input/output module 2070 may allow a user to send action requests to electronic system 2000. An action request may be a request to perform a particular action. For example, an action request may be to start or end an application or to perform a particular action within the application. User input/output module 2070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2000. In some embodiments, user input/output module 2070 may provide haptic feedback to the user in accordance with instructions received from electronic system 2000. For example, the haptic feedback may be provided when an action request is received or has been performed.

Electronic system 2000 may include a camera 2050 that may be used to take photos or videos of a user, for example, for tracking the user's eye position. Camera 2050 may also be used to take photos or videos of the environment, for example, for VR, AR, or MR applications. Camera 2050 may include, for example, a CMOS image sensor with a few millions or tens of millions of pixels. In some implementations, camera 2050 may include two or more cameras that may be used to capture 3-D images.

In some embodiments, electronic system 2000 may include a plurality of other hardware modules 2080. Each of other hardware modules 2080 may be a physical module within electronic system 2000. While each of other hardware modules 2080 may be permanently configured as a structure, some of other hardware modules 2080 may be temporarily configured to perform specific functions or temporarily activated. Examples of other hardware modules 2080 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2080 may be implemented in software.

In some embodiments, memory 2020 of electronic system 2000 may also store a virtual reality engine 2026. Virtual reality engine 2026 may execute applications within electronic system 2000 and receive position information, acceleration information, velocity information, predicted future positions, or any combination thereof of the HMD device from the various sensors. In some embodiments, the information received by virtual reality engine 2026 may be used for producing a signal (e.g., display instructions) to display module 2060. For example, if the received information indicates that the user has looked to the left, virtual reality engine 2026 may generate content for the HMD device that mirrors the user's movement in a virtual environment. Additionally, virtual reality engine 2026 may perform an action within an application in response to an action request received from user input/output module 2070 and provide feedback to the user. The provided feedback may be visual, audible, or haptic feedback. In some implementations, processor(s) 2010 may include one or more GPUs that may execute virtual reality engine 2026.

In various implementations, the above-described hardware and modules may be implemented on a single device or on multiple devices that can communicate with one another using wired or wireless connections. For example, in some implementations, some components or modules, such as GPUs, virtual reality engine 2026, and applications (e.g., tracking application), may be implemented on a console separate from the head-mounted display device. In some implementations, one console may be connected to or support more than one HMD.

In alternative configurations, different and/or additional components may be included in electronic system 2000. Similarly, functionality of one or more of the components can be distributed among the components in a manner different from the manner described above. For example, in some embodiments, electronic system 2000 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A micro-light emitting diode (micro-LED) device comprising:
   a backplane including pixel drive circuits and a plurality of metal contacts in a first dielectric material layer;
   an array of micro-LEDs on the backplane, wherein each micro-LED of the array of micro-LEDs comprises:
      a metal electrode bonded to a metal contact of the plurality of metal contacts, wherein the metal contact has an area smaller than an area of the metal electrode and aligns with a region of the metal electrode;
      a second dielectric layer on sidewalls of the metal electrode;
      a back reflector on the metal electrode;
      epitaxial layers on the back reflector and configured to emit visible light; and
      a passivation layer on sidewalls of the back reflector and a portion of the epitaxial layers,
      wherein an area of a first side of the epitaxial layers adjacent to the back reflector is equal to or less than the area of the metal electrode and is equal to or less than an area of a second side of the epitaxial layers opposing the first side; and
   a common electrode between micro-LEDs of the array of micro-LEDs and coupled to sidewalls of the second side of the epitaxial layers in each micro-LED of the array of micro-LEDs.

2. The micro-LED device of claim 1, further comprising a partial reflector layer on the array of micro-LEDs, the partial reflector layer and the back reflector of each micro-LED of the array of micro-LEDs forming a resonant cavity for the visible light emitted in the epitaxial layers.

3. The micro-LED device of claim 1, wherein the back reflector includes:
   a distributed Bragg reflector including:
      a plurality of transparent oxide layers; and
      a metal plug in the plurality of transparent oxide layers; and
   a transparent current spreading layer between the epitaxial layers and the distributed Bragg reflector; and
   a conductive material layer on the distributed Bragg reflector and opposing the transparent current spreading layer,
   wherein the metal plug electrically couples the transparent current spreading layer to the conductive material layer, and
   wherein an area of the back reflector is equal to the area of the first side of the epitaxial layers.

4. The micro-LED device of claim 3, wherein:
   a pitch of the array of micro-LEDs is less than 3 µm; and
   a linear dimension of the metal plug is less than 20% of the pitch of the array of micro-LEDs.

* * * * *